United States Patent
Kaehr et al.

(10) Patent No.: US 10,214,833 B1
(45) Date of Patent: Feb. 26, 2019

(54) ADDITIVE MANUFACTURING OF CRYSTALLINE MATERIALS

(71) Applicant: National Technology & Engineering Solutions of Sandia, LLC, Albuquerque, NM (US)

(72) Inventors: Bryan James Kaehr, Albuquerque, NM (US); Stanley Shihyao Chou, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 193 days.

(21) Appl. No.: 15/217,582

(22) Filed: Jul. 22, 2016

(51) Int. Cl.
    *C30B 7/00* (2006.01)
    *C30B 29/54* (2006.01)
    *C30B 25/10* (2006.01)

(52) U.S. Cl.
    CPC .............. *C30B 7/00* (2013.01); *C30B 25/105* (2013.01); *C30B 29/54* (2013.01)

(58) Field of Classification Search
    CPC ................................ C30B 7/00; C30B 25/105
    See application file for complete search history.

(56) References Cited

U.S. PATENT DOCUMENTS

| | | | |
|---|---|---|---|
| 8,859,190 B1 | 10/2014 | Dirk et al. | |
| 9,273,305 B1 | 3/2016 | Kaehr et al. | |
| 2002/0016075 A1* | 2/2002 | Peng | H01L 31/1884 438/700 |
| 2003/0235136 A1* | 12/2003 | Akselrod | B82Y 10/00 369/108 |
| 2004/0003627 A1* | 1/2004 | Hashima | C03C 4/12 65/33.2 |
| 2004/0106237 A1* | 6/2004 | Yamazaki | H01L 29/66757 438/149 |
| 2005/0241568 A1* | 11/2005 | Sasaki | C30B 7/00 117/68 |
| 2008/0035898 A1* | 2/2008 | Tsuchiya | C09K 11/7787 252/600 |
| 2014/0163717 A1* | 6/2014 | Das | B22F 3/1055 700/119 |
| 2015/0064057 A1 | 3/2015 | Grigoropoulos et al. | |
| 2016/0208238 A1 | 7/2016 | Kaehr et al. | |
| 2016/0368056 A1* | 12/2016 | Swaminathan | B29C 64/153 |

(Continued)

FOREIGN PATENT DOCUMENTS

JP      2000026120 A   *   1/2000      ............. C10G 19/00

OTHER PUBLICATIONS

European Patent Office, English computer translation of JP2000026120 (2018).*

(Continued)

*Primary Examiner* — Matthew J Song
(74) *Attorney, Agent, or Firm* — Helen S. Baca

(57) ABSTRACT

The present invention relates to additive manufacturing methods, in which crystalline materials can be formed by using a liquid precursor. In particular embodiments, the crystalline material is a perovskite. The methods include the use of a thermal voxel, which can be translated to form any arbitrary pattern of initial crystalline seed structure(s). Then, the seed structure can be incubated to promote crystal growth and/or crystal dissolution, thereby providing a patterned crystalline material.

26 Claims, 15 Drawing Sheets

(56) References Cited

U.S. PATENT DOCUMENTS

2017/0189965 A1* 7/2017 Vaidya ............... B22F 7/008
2017/0203364 A1* 7/2017 Ramaswamy ........ B22F 3/1055

OTHER PUBLICATIONS

U.S. Appl. No. 14/795,366, filed Jul. 9, 2015, Kaehr et al.
U.S. Appl. No. 15/217,606, filed Jul. 22, 2016, Kaehr et al.
U.S. Appl. No. 15/282,511, filed Sep. 30, 2016, Kaehr.
Ahmed S et al., "Direct deposition strategy for highly ordered inorganic organic perovskite thin films and their optoelectronic applications," *Opt. Mater. Express* 2014;4(7):1313-23.
Alias MS et al, "Enhanced Etching, surface damage recovery, and submicron patterning of hybrid perovskites using a chemically gas-assisted focused-ion beam for subwavelength grating potonic applications," *J. Phys. Chem. Lett.* 2016;7:137-42.
An BW et al., "Direct printing of reduced graphene oxide on planar or highly curved surfaces with high resolutions using electrohydrodynamics," *Small* 2015;11(19):2263-8.
Arnold CB et al., "Laser direct-write techniques for printing of complex materials," *MRS Bull*2007;32:23-31.
Bade SGR et al., "Fully printed halide perovswkite ligh-emitting diodes with silver nanowire electrodes." *ACS Nano* 2016;10(2):1795-801.
Baldacchini T. "Multiphoton laser direct writing of two-dimensional silver structures," *Opt. Express* 2005;13(4):1275-80.
Beilsten-Edmands J et al., "Non-ferroelectric nature of the conductance hysteresis in $CH_3NH_3PbI_3$ perovskite-based photovoltaic devices," *Appl. Phys. Lett.* 2015;106:173502 (5 pp.).
Belé D et al., "Direct-write depositon and focused-electron-beam-induced purification of gold nanostructures," *ACS Appl. Mater. Interfaces* 2015;7:2467-79.
Blasco E et al., "Fabrication of conductive 3D gold-containing microstructures via direct laser writing," *Adv. Mater.* 2016 DOI: 10.1002/adma.201506126 [Epub ahead of print] (4 pp.).
Cahill DG et al.., "Nanoscale thermal trasport, II. 2003-2013," *Appl. Phys. Rev.* 2014;1:011305 (46 pp.).
Cahill DG, "Analysis of heat flow in layered structures for time-domain thermoreflectance," *Rev. Sci. Instrum.* 2004;75:5119-22.
Cao YY et al., "3D metallic nanostructure fabrication by susfactant-assisted multiphoton-induced reduction," *Small* 2009;5(10):1144-8.
Cao YY et al., "Morphology and size dependence of silver microstructures in fatty salts-assisted multiphoton photoreduction microfabrication," *Appl. Phys. A* 2009;96:453-8.
Chen B et al., "Origin of J-V hysteresis in perovskite solar cells," *J. Phys. Chem. Lett.* 2018:7(5):905-17.
Cheng ZY et al., "Patterning and photoluminescent properties of perovskite-type organic/inorganic hybrid luminescent films by soft lithography," *Chem. Phys. Lett.* 2003;376(3-4):481-6.
Choi HW et al., "Recent develpments and directions in printed nanomaterials," *Nanoscale* 2015;7:3338-55.
Chou SS et al., "Chemically exfoliated $MoS_2$ as near-infrared photothermal agents," *Angew. Chem. Int. Ed.* 2013;52(15):4160-4.
Chou SS et al., "Laser direct write synthesis of lead halide perovskites," *J. Phys. Chem. Lett.* 2016;7(19):3736-41.
Chou SS et al., "Nanoscale graphene oxide (nGO) as artificial receptors: Implications for biomolecular interactions and sensing," *J. Am. Chem. Soc.* 2012;134(40):16725-33.
Chou SS et al., "Understanding catalysis in a multiphasic two-dimensional transition metal diohalcogenide," *Nature Commun.* 2015;6:8311 (8 pp.).
Delaporte P et al., "Laser-induced forward transfer: a high resolution addivitve manufacturing technology," *Opt. Laser Technol.* 2016;78:33-44.
Docampo P et al., "Efficient organometal inhalide perovskite planer-heterojunction solar cells on flexible polymer substrates," *Nature Commun.* 2013;4:2761 (6 pp.).
Dong WJ et al., "Ultrafast laser-assisted synthesis of hydrogenated molybdenum oxides for flexible orogenic solar cells," *J. Mater. Chem. A* 2016;4:4755-62.
Dwivedi VK et al., "Direct deposition of inorganic-organic hybrid semiconductors and their template-assisted microstructures," *Mater. Chem. Phys.* 2013;137:941-6.
Farrer RA et al., "Selective functionalization of 3-D polymer microstructures," *J. Am. Chem. Soc.* 2006;128:1796-7.
Feng J et al., "'Liquid knife' to fabricate patterning single- crystalline perovskite microplates toward high-performance laser array," *Adv. Mater.* 2016;28(19):3732-41.
Flevet F et al., "Homogeneous and heterogeneous nucleations in the polyol process for the preparation of micron and sub-micron size metal particles," *Solid State Ionics* 1989;32/33:198-205.
Fishcer J et al., "The materials challenge in diffraction-unlimited direct-laser writing optical lithography," *Adv. Mater.* 2010;22:3578-82.
Foley BM et al., "Protein thermal conductivity measured in the solid state reveals anharmonic interactions of vibrations in a fractal structure," *J. Phys. Chem. Lett.* 2014;5(7):1077-82.
Fu Y et al., "Solution growth of single crystal methylammonium lead halide perovskite nanostructures for optoelectronic and photovoltaic applications," *J. Am. Chem. Soc.* 2015;137(17):5810-8.
Gansel JK et al., "Gold helix photonic metametarial as broadband circular polarizer," *Science* 2009;325(5947):1513-5.
Ge J et al., "Protein-inorganic hybrid nanoflowers," *Nat Nanotechnol.* 2012;7(7):428-32.
Gottesman R et al., "Extremely slow photoconductivity response of $CH_3NH_3PbI_3$ poerovskites suggesting structural changes under working conditions," *J. Phys. Chem. Lett.* 2014;5(15):2662-9.
Gu C et al., "Flexible hybrid organic-inorganic perovskite memory," *ACS Nano* 2016;105(5):5413-8.
Han S et al., "Nanorecycling: monolithic integration of popular and copper oxide nanowire network electrode through selective reversible photothermochemical reduction," *Adv. Mater.* 2015;27(41):6397-403.
Harper JC et al., "Biocompatible microfabrication of 3D isolation chambers for targeted confinement of individual cells and their progeny," *Anal. Chem.* 2012;84(21):8595-9.
Hopkins PE et al., "Measuring the thermal conductivity of porous, transparent $SiO_2$ films with time domain reflectance," *J. Heat Transfer* 2011;133(8):061601 (6 pp.).
Hopkins PE et al., "Ultrafast and steady-state laser heating effects on electron relaxation and phonon coupling mecahnisms in thin gold film," *Appl. Phys. Lett.* 2013;103:211910 (6 pp.).
Hopkins PE, "Thermal transport across solid interfaces with nanoscale imperfections: effects of roughness, disorder, dislocations, and bonding on thermal boundary conductance," *ISRN Mech. Eng.* 2013(2013):682586 (19 pp.).
Hwang DJ et al., "On demand-direct synthesis of Si and Ge nanowires on a single platform by focused laser illumination," *Appl. Phys. Lett.* 2011;99:123109 (4 pp.).
In JB et al., "Generation of single-crystalline domanin in nano-scale silicon pillars by near-field short pulsed laser," *Appl. Phys. A* 2014;114(1);277-85.
In JB et al., "In situ monitoring of laser-assisted hydrothermal growth of ZnO nanowirews: thermally deactivating growth kinetics," *Small* 2014;10:741-9.
In JB et al., "Laser crystalization and localized growth of nanomaterials for solar applications," *Proc. SPIE* 2013;8826:88260E (5 pp.).
Ishikawa A et al., "Improvement in the reduction of silver ions in aqueous solution using two-photon sensitive dye," *Appl. Phys. Lett.* 2006;89:113102 (4 pp.).
Jayawardena KDG et al., "Morphology control of zinc oxide nancrystals via hybrid laser/hydrothermal synthesis," *J. Phys. Chem. C* 2010;114:12931-7.
Kaehr B et al., "Direct-write fabrication of functional protein matrixes using a low-cost Q-switched laser," *Anal. Chem.* 20006;78(9):3198-202.
Kaehr B et al., "Direct-write graded index materials realized in protein hydrogels," *Appl. Phys. Lett.* 2016;109:123701 (4 pp.).
Kaehr B et al., "Guiding neuronal development with in situ microfabrication," *Proc. Nat'l Acad. Sci. USA* 2004;101(46):16104-8.

(56) References Cited

OTHER PUBLICATIONS

Kaehr B et al., "High-thorughput design of microfluidics based on directed bacterial motility," *Lab Chip* 2009;9:2632-7.

Kaehr B et al,, "Mask-directed multiphoton lithography," *J. Am. Chem. Soc.* 2007;129(7);1904-5.

Kaehr B et al., "Multiphoton fabrication of chemically responsive protein hydrogels for microactuation," *Proc. Nat'l Acad Sci. USA* 2008;105:8850-4.

Kaehr B, "Laser Direct Write at the Solid/Liquid Interface: Bridging Solution-Based Chemistry to Additive Manufacturing," presented at the $11^{th}$ *International High Power Laser Ablation and Directed Energy Symposium*, on Apr. 6, 2016 at Santa Fe, NM (27 pp.).

Kaehr BJ et al., "Using bacterial cell growth to template catalytic asymmetry," *Chem. Commun.* 2010;4:5268-70.

Kaehr BJ, "Alloys and composites for strong and tough freeform nanomaterials," *Sandia National Laboratories, Laboratory Directed Research and Development 2014 Annual Report*, SAND No. 2015-2219, Mar. 2015, pp. 157-158.

Kaehr BJ, "Defining cellular microenvironments using multiphoton lithograhy," *Ph.D. dissertation for the Department of Biochemistry, University of Texas* at Austin, Aug. 2007, 172 pp.

Kanaujia PK et al., "Laser-induced microstructuring of two-dimensional layered inorganic-organic perovskites," *Phys. Chem. Chem. Phys.* 2016;18:9666-72.

Kaneko K et al., "Two-photon photoreduction of metallic nanoparticle gratings in a polymer matrix," *Appl. Phys. Lett.* 2003;82:1426-8.

Kang B et al., "One-step fabrication of copper eletrode by laser-induced direct local reduction and agglomeration of copper oxide nanoparticle," *J. Phys. Chem. C* 2011;115:23664-70.

Kang SY et al., "One-step direct-laser metal writing of sub-100nm 3D silver nanostructures in a gelatin matrix," *Nanotechnology* 2016;26:121001 (6 pp.).

Kempa T et al., "Photochemical synthesis and multiphoton luminescence of monodisperse silver nanocrystals," *Plasmonics* 2006;1:45-51.

Khripin CY et al., "Mechanistically tunable multiphoton fabricated protein hydrogels investigated using atomic force microscopy," *Soft Matter* 2010;6:2842-8.

Khripin CY et al., "Protein-directed assembly of arbitrary three-dimensional nanoporous silica architectures," *ACS Nano* 2011;5(2):1401-9.

Kim K et al., "3D optical printing of piezoelectric nanoparticle-polymer composite materials," *ACS Nano* 2014;8(10):9799-806.

Kim M et al., "Application of small angle neutro scattering to analyze precision nickel mesh for electro-magnetic interference shielding formed by continuous electroforming technique," *Physics B* 2006;385-6(2):914-6.

Kim P et al., "Structural transformation by electrodepositon o patterned substrates (STEPS) a new versatile nanofabrication method," *Nano Lett.* 2012;12:527-33.

Ko SH et al., "All-inkjet-printed flexible electronics fabrication on a polymer substrate by low-temperature high-resolution selective laser entering of metal nanoparticles," *Nanaotechbnology* 2007;18(34):345202 (8 pp.).

Kochemirovsky VA et al., "Laser-induced chemical liquid phase deposition of metals: chemical reactions in solution and activation of dieletric surfaces," *Russian Chem. Rev.* 2011;80(9):869-82.

Kojima A et al., "Organometal halide perovskites as visible-light sensitizers for photovoltaic cells," *J. Am. Chem. Soc.* 2009;131(17):6050-1.

Kordàs K et al., "Laser direct writing of copper on polymide surfaces from solution," *Appl. Surf. Sci.* 2000;154-155:399-404.

Kwata S et al., "Finer features for functional microdevices," *Nature* 2001;412(6848):697-8.

LaFratta CN et al., "Direct laser patterning of conductive wires on three-dimensional polymeric microstructures," *Chem. Mater.* 2006;18:2038-42.

LaFratta CN et al., "Multiphoton fabrication," *Angew. Chem. Int. Ed.* 2007;46:6238-58.

Lee D et al., "Vacuum-free, maskless patterning of Ni electrodes by laser reductive sintering of NiO nanoparticle ink and its application to transparent conductors," *ACS Nano* 2014;8:9807-14.

Lin D et al., "Three-dimensional printing of complex structures: man made or toward nature?," *ACS Nano* 2014;8(10):9710-5.

Liu Y et al., "Two-inch-sized perovskite $CH_3NH_3PbX_3$ (X=Cl, Br, I) crystals growth and characterization," *Adv. Mater.* 2015;27:5176-83.

Lu WE et al., "Direct laser writing of metallic nanstructures for nanophotonics," *CLEO Tech. Digest* 2013;JW2A.51 (2 pp.).

Meza LR et al., "Strong, lighweight, and recoverable three-dimensional ceramic nanolattices," *Science* 2014;345(6202):1322-6.

Nakajima T et al., "UV-assisted nucleation and growth of oxide films from chemical solutions," *Chem. Soc. Rev.* 2014;43:2027-41.

Nielson R et al., "Microreplication and design of biological architectures using dynamic mask multiphoton lithography," *Small* 2009;5(1):120-5.

Niu G et al., "Review of recent progress in chemical slability of perovskite solar cells," *J. Mater. Chem. A* 2015;3:8970-80.

Niu L et al., "Controlled synthesis of organic/inorganic van der Waals solid for tunable light-matter interactions," *Adv. Mater.* 2015;27(47):7800-8.

Norris PM et al., "Tuning phonon transport from interfaces to nanostructures," *J. Heat Transer* 2013;135(6):061604 (13 pp.).

Ritschdorff ET et al., "Multiphoton lithography using a high-repetition rate microchip laser," *Anal. Chem.* 2010;82(20):8733-7.

Ryu E et al., "On demand shaped-slective intergration of individual vertical germanium nanowires on a Si(111) substrate via laser-localized heating," *ACS Nano* 2013;7(3):2090-8.

Saidaminov MI et al., "High-quality bulk hybrid perovskite single crystals within minutes by inverse temperature crystallization," *Nature Commun.* 2015;6:7586 (6 pp.).

Saidaminov MI et al., "Planar-intergrated single-crystalline perovskite photodetectors," *Nature Commun.* 2015;6:8724 (7 pp.).

Saliba M et al., "Structured organic-inorganic perovskite toward a distributed feedback laser," *Adv. Mater.* 2016;28:923-9.

Schäf O et al., "Hydrothermal synthesis of nanomaterials," in *Nanostructured Materials: Selected Synthesis Methods Properties and Applications* (eds. P. Knauth & J. Schoonman), 2002, Springer US, pp. 23-41.

Selimis A et al., "Direct laser writing: principles and materials for scaffold 3D printing," *Microelectron. Eng.* 2015;132:83-9.

Shear JB et al., "Multiphoton-excited fluorescence in bioanalytical chemistry," *Anal. Chem.* 1999;77(17):598A-605A.

Shibuya K et al., "Scintillation properties of $(C_6H_{10}NH_3)_2PbI_4$: excition luminescenceof an organic/inorganic multiple quantum well structures compound induced by 2.0 MeV protons," *Nucl. Instr. Methods Phys. Res. B* 2002;194(2):207-12.

Shim J et al., "Hydrothermal fabrication of patterned ZnO nanorod clusters using laser direct wirting," *2012 International Conference on Optical MEMS and Nanophotonics (OMN)*, held on Aug. 6-9, 2012 in Banff, AB, Canada, pp. 190-191.

Stellacci F et al., "Laser and electron-beam induced growth of nanoparticles for 2D and 3D metal patterning," *Adv. Mater.* 2002;14(3):194-8.

Stumpp M et al., "I-V hysteresis of methylammonium lead halide perovskite films on microstructured electrode arrays: dependence on preaparaton route and voltage scale," *Phys. Status Solid A* 2016;213(1):38-45.

Sugioka K et al., "Femtosecond laser three-dimensional micro- and nanofabrication," *Appl. Phys. Rev.* 2014;1:041303 (36 pp.).

Sum TC et al., "Advancements in perovskite solar cells: photophysics behind the photovoltaics," *Energy Environ. Sci.* 2014;7:2518-34.

Swanson JR et al., "Laser-assisted depositon of iron on Si(111)–(7×7): the mehcanism and energetics of $Fe(CO)_5$ decompositon," *J. Chem. Phys.* 1987;87(8):5028-37.

Swartz ET et al., "Thermal boudary resistance," *Rev. Modern. Phys.* 1989;61(3):605-68.

Tanaka K et al., "Comparative study on the excitions in lead-halide-based perovskite-type crystals $CH3NH_3PbBr_3$ $CH_3NH_3PbI_3$," *Solid State Commun.* 2003;127(9-10):619-23.

(56) References Cited

OTHER PUBLICATIONS

Tanaka T et al., "Two-photon-induced reduction of metal ions for fabricating three-dimensional electrically conductive metallic microstructure," *Appl. Phys. Lett.* 2006;88:081107 (4 pp.).
Tas G et al., "Electron diffusion in metals studied by picosecond ultrasonics," *Phys. Rev. B* 1994;49:15046-54.
Tas G et al., "Picosecond ultrasonic study of phonon reflection from solid-liquid interfaces," *Phys. Rev. B* 1997;55:1852-7.
Truccato M et al., "Direct-write x-ray nanopatterning: a proof of concept Josephson device on $Bi_2Sr_2CaCu_2Oa_{0=}$ superconducting oxide," *Nano Lett.* 2016;16:1669-74.
van Dorp WF et al., "A critical literature review of focused electron beam induced depositon," *J. Appl. Phys.* 2008;104:081301 (43 pp.).
Vora KI., "Three-dimensional nanofabrication of silver structures in polymer with direct laser writing," *Ph.D. dissertation for the Department of Applied Physics, Harvard University*, Feb. 2014, 132 pp.
Wang G et al., "Wafer-scale growth of large arrays of perovskite microplate crystals for functional electronics and optoelectronics," *Sci. Adv.* 2015;1(9):e1500613 (9 pp.).
Wang H et al., "Controllable assemby of silver nanoparticles induced by femtosecond laser direct writing," *Sci. Technol. Adv. Mater.* 2015;16:024805 (7 pp.)
Wang K et al., "High-density and uniform lead halide perovskite nanolaser array on silicon," *J. Phys., Chem. Lett.* 2016;7(13):2549-55.
Wang W et al., "Progress in solid oxide fuel cells with nickel-based anodes operating on methane and related fuels," *Chem. Rev.* 2013;113:(10):8104-51.
Wang XC et al., "Laser induced copper electroless plating on polyimide with Q-switch Nd:YAG laser," *Appl. Surf. Sci.* 2002;200:165-71.
Weber D, "$CH_3NH_3PbX_3$, ein Pb(II)-System mit kubishcer Perowskitstuktur" [$CH_3NH_3PbX_3$, a Pb(II)-system with cubic perovskite structure], *Z. Naturoriosch.* [*Journal for Nature Research*] 1978:33b:1443-5 (English abstract).
Wexier D et al., "Laser-assisted depositon of pure gold from $(CH_3)_3Au$(hexafluorozcetyl acetonate) and gas-phase luminescence identification of photoliagments." *J. Phys. Chem.* 1993;97:13563-7.
Whittingham MS, "Hydrothermal synthesis of trasition metal oxides under mild conditons," *Curr. Op. Solid State Mater. Sci.* 1996;1(2):227-32.
Wu ES. "Two-photon lithography for microelectronic application," *Proc. SPIE* 1992;1674:776 (7 pp.).
Wu PW et al., "Two-photon photographic production of three-dimensional metallic structures within a dielectric matrix," *Adv. Mater.* 2000;12(19):1438-41.
Xiao Z et al., "Giant switchable photovoltaic effect in organometal trihalide perovskite devices," *Nature Mater.* 2015;14:193-8.
Xiong W et al., "Direct writing of grphene patterns on insulating substrates under ambient conditions," *Sci. Rep.* 2014;4:4892 (6 pp.).
Xu BB et al., "Fabrication of microelectrodes based on precursor doped with metal seeds by femtosecond laser direct writing," *Opt. Lett.* 2014;39(3):434-7.
Xu BB et al., "Flexible nanowiring of metal on nonplanar substrates by femtosecond-laser-induced electroless plating," *Small* 2010;6:1762-6.
Xu X et al., "UV-laser photodepositon of iron films from $Fe(CO)_3$: role of gas-phase and surface dissociation processes," *Appl. Surf. Sci.* 1990;45:281-300.
Ynag GW, "Laser ablation in liquids: applications in the synthesis of nanocrystals," *Prog. Mater. Sci.* 2007;52:648-98.
Yeo J et al., "Digital 3D local growth of iron oxide micro- and nonorods by laser-induced photothermal chemical liquid growth," *J. Phys. Chem. C* 2014;118:15448-54.
Yeo J et al., "Laser-induced hydrothermal growth of hereogeneous metal-oxides nanowire on flexibel substrate by laser absorption layer design," *ACS Nano* 2015;9(6):6059-68.
Yeo J et al., "Rapid, one-step digital selective growth ZnO nanowiress on 3D structures using laser induced hydrothermal growth," *Adv. Funct. Mater.* 2013;23:3316-23.
Zarzar LD et al., "Direct writing and actuation of three-dimensionally paterned hydrogel pads on micropillar supports," *Angew. Chem. Int. Ed.* 2011;50(40):9356-60.
Zarzar LD et al., "Multiphoton lithogrphy of nanocrsytalline platinum and palladium for site-specific catalysis in 3D microenvironments," *J. Am. Chem. Soc.* 2012;134(9):4007-10.
Zarzar LD et al., "Using laser-induced thermal voxels to pattern diverse materials at the solid-liquid interface," *ACS Appl. Mater. Interfaces* 2016;8(33):21134-9.
Zarzar LD, "Dynamic hybrid materials: hydrogel actuators and catalytic microsystems," *Ph.D. dissertaiton for the Department of Chemistry, Harvard University*, May 2013, 154 pp.
Zhang YL. et al., "Disignable 3D Nanofabrication by femtosecond laser direct writing," *Nano Today* 2010;5:435-48.
Zhu H et al., "Lead halide perovskite nanowire lasers with low lasing thresholds and high quality factors," *Nature Mater.* 2015;14:636-42.

\* cited by examiner

MAPbBr$_2$ wire

ADDITIVE MANUFACTURING OF CRYSTALLINE MATERIALS

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to additive manufacturing methods, in which crystalline materials can be formed by using a liquid precursor. In one instance, the method allows for direct writing of arbitrary patterns containing crystalline seed structures.

BACKGROUND OF THE INVENTION

High quality crystalline structures have many potential applications. For instance, crystalline semiconductor materials are useful for functional electronic, optical, and optoelectronic devices. One such material includes an organometallic perovskite, which can have beneficial optical gain properties, long carrier lifetimes, and tunable wavelengths.

Material processing remains a challenge. For instance, incorporating organometallic perovskite into a functional device requires consideration of downstream synthetic and processing conditions, which can drastically impact the physical properties of the perovskite material. Typical lithography processes can be incompatible with perovskite materials, which can degrade in the presence of particular solvents and etchants. Thus, there is a need for additional manufacturing methods capable of in situ deposition of crystalline materials (e.g., crystalline semiconductor materials) in a controlled manner.

SUMMARY OF THE INVENTION

The present invention relates to making a crystalline material, in which the method relies on inducing the formation of an initial crystalline seed by use of a thermal voxel. This thermal voxel provides a thermal gradient within an initial liquid precursor, which induces formation of the crystalline seed. As this voxel can be positioned at an arbitrary location upon a substrate, the initial crystalline seed can have any useful pattern. Then, further incubation results in growth of the seed into a crystalline material (e.g., incubation within the initial liquid precursor or another liquid precursor having optimal concentrations of the precursor(s) to promote crystal growth). Alternatively, further incubation can result in crystal dissolution, which can be employed to refine the initially deposited seed.

Accordingly, in one aspect, the present invention features a method of making a crystalline material, the method including: inducing an initial crystalline seed by positioning a direct write source at a first position on a substrate, where the direct write source is configured to produce a thermal voxel and where a first liquid precursor is in proximity to the substrate; and promoting crystal growth or crystal dissolution of the seed. In some embodiments, the method thereby provides a crystalline material that is patterned upon the substrate, where the seed and/or the crystalline material is a product arising from thermal heating of the liquid precursor by the thermal voxel.

In one instance, the substrate includes a top surface and a bottom surface, in which the first liquid precursor is in proximity to the top surface of the substrate and the direct write source is disposed in proximity to the bottom surface of the substrate. In one non-limiting embodiment, the bottom surface of the substrate (or an absorber disposed in proximity to the substrate) is heated.

In another instance, the method provides a crystalline perovskite material. Accordingly, in another aspect, the present invention features a method of making a crystalline perovskite material, the method including: providing a first liquid precursor including an organic component (e.g., including any A cation described herein) and a metal component (e.g., including any B metal described herein), in which a reaction between the organic component and the metal component produces an initial crystalline perovskite seed, where the liquid precursor is in proximity to a substrate; inducing formation of the initial crystalline perovskite seed by positioning a direct write source at a first position on the substrate, where the direct write source is configured to produce a thermal voxel within a volume of the first liquid precursor; and promoting crystal growth or crystal dissolution of the initial crystalline perovskite seed. In some embodiments, the method thereby provides a crystalline perovskite material that is patterned upon the substrate, where the initial crystalline perovskite seed and/or crystalline perovskite material is a product arising from thermal heating of the liquid precursor by the thermal voxel.

Crystal growth and crystal dissolution can be effected in any useful manner. In one instance, growth is promoted by broadband illumination. In another instance, dissolution is promoted by providing a liquid precursor of an appropriate concentration to promote dissolution. Additional conditions are described herein.

Liquid precursors can be optimized to promote seed formation and/or crystal growth, in which same or different liquid precursors can be employed for each step. In some embodiments, a first liquid precursor that is employed for producing an initial seed is different than a second liquid precursor employed for growing a crystal based on that initial seed. For instance, the first liquid precursor can include precursor reagent(s) at a concentration beneficial for seed formation, the second liquid precursor can include precursor reagent(s) at a concentration beneficial for crystal growth, and these concentrations can be the same or different. In another instance, the first liquid precursor can include a solvent that is beneficial for seed formation, but the second liquid precursor can include another solvent that promotes crystal growth of high quality crystal structures or promotes crystal dissolution in a controlled manner. In yet another instance, a depleted liquid precursor (e.g., during a crystal growth step) can be replaced with another liquid precursor. In some embodiments, a first liquid precursor that is employed for producing an initial seed is different than a second liquid precursor employed for dissolving a crystal based on that initial seed. Thus, the methods herein can optionally include a step of exchanging the first liquid precursor for a second liquid precursor.

A liquid precursor can include any useful combination of a solvent and one or more precursor reagents. Exemplary precursor reagents include one or more of the following precursor reagents: $AX^1_m$, $BX^2_n$, $AY_m$, and/or $BY_m$, in which each of m and n is, independently, a number of from about 1 to 5, A includes a cation (e.g., a cationic organic moiety) or a metal (e.g., a cationic metal, such as an alkali metal), B includes a metal (e.g., a metal cation, such as a divalent metal cation), each of $X^1$ and $X^2$, independently, includes a halogen (e.g., a halogen anion or a halide), and Y includes a leaving group (e.g., halo, perfluoro, etc.). In some embodiments, a reaction between two or more of the precursor reagents produces an initial crystalline seed and/or a crystalline material having a formula $ABX^1_3$, $ABX^2_3$, or $ABX^1_aX^2_b$, in which a+b=3. Additional precursor reagents are described herein.

Any useful crystalline material can be formed. Exemplary crystalline materials include a crystalline semiconductor material, such as a crystalline perovskite material. In one non-limiting embodiment, the perovskite material has a formula of $ABX_3$, $A_2BX_4$, $A_4BX_6$, or $A_4B_3X_{10}$, in which each A, independently, includes a cation, an organic moiety, or an alkali metal; each B, independently, includes a metal (e.g., a metal cation, such as a divalent metal cation); and each X, independently, includes a halogen (e.g., a halogen anion or a halide). Each A, B, and X within each formula can be the same or different, such as $(CH_3NH_3)PbBr_3$ in which each X is the same (i.e., each X is Br) and such as in $(CH_3NH_3)PbBr_mI_{3-m}$, in which each X is different (i.e., X is Br or I, and 0<m<3).

In another aspect, the present invention features a method of making a crystalline material, the method including: inducing an initial crystalline seed by positioning a direct write source at a first position on a substrate, where the direct write source is configured to produce a thermal voxel and where a first liquid precursor is in proximity to the substrate; and promoting crystal growth of the seed. In some embodiments, the method thereby provides a crystalline material that is patterned upon the substrate, where the seed and the crystalline material are products arising from thermal heating of the liquid precursor by the thermal voxel.

In any embodiment herein, the direct write source is any described herein (e.g., a continuous wave laser source or a pulsed wave laser source, such as that which has a wavelength of from about 500 nm to about 1,000 nm).

In any embodiment herein, the thermal voxel can be defined, in part, by the beam diameter of the direct write source. The beam diameter can have any useful diameter (e.g., of from about 10 nm to about 1,000 nm, including from 10 nm to 500 nm, 10 nm to 750 nm, 10 nm to 900 nm, 25 nm to 500 nm, 25 nm to 750 nm, 25 nm to 1,000 nm, 50 nm to 500 nm, 50 nm to 750 nm, 50 nm to 1,000 nm, 75 nm to 500 nm, 75 nm to 750 nm, 75 nm to 1,000 nm, 100 nm to 500 nm, 100 nm to 750 nm, 100 nm to 1,000 nm, 125 nm to 500 nm, 125 nm to 750 nm, 125 nm to 1,000 nm, 150 nm to 500 nm, 150 nm to 750 nm, 150 nm to 1,000 nm, 175 nm to 500 nm, 175 nm to 750 nm, 175 nm to 1,000 nm, 200 nm to 500 nm, 200 nm to 750 nm, 200 nm to 1,000 nm, 225 nm to 500 nm, 225 nm to 750 nm, 225 nm to 1,000 nm, 250 nm to 500 nm, 250 nm to 750 nm, 250 nm to 1,000 nm, 275 nm to 500 nm, 275 nm to 750 nm, 275 nm to 1,000 nm, 300 nm to 500 nm, 300 nm to 750 nm, or 300 nm to 1,000 nm).

In any embodiment herein, the thermal voxel can provide thermal heating characterized by a temperature change of from about 300 K to about 4,000 K (e.g., from 300K to about 1,000 K, 300 K to 1,500 K, 300 K to 2,000 K, 300 K to 2,500 K, 300 K to 3,000 K, 300 K to 3,500 K, 350K to about 1,000 K, 350 K to 1,500 K, 350 K to 2,000 K, 350 K to 2,500 K, 350 K to 3,000 K, 350 K to 3,500 K, 350K to about 4,000 K, 400K to about 1,000 K, 400 K to 1,500 K, 400 K to 2,000 K, 400 K to 2,500 K, 400 K to 3,000 K, 400 K to 3,500 K, 400K to about 4,000 K, 450K to about 1,000 K, 450 K to 1,500 K, 450 K to 2,000 K, 450 K to 2,500 K, 450 K to 3,000 K, 450 K to 3,500 K, 450K to about 4,000 K, 500K to about 1,000 K, 500 K to 1,500 K, 500 K to 2,000 K, 500 K to 2,500 K, 500 K to 3,000 K, 500 K to 3,500 K, 500K to about 4,000 K, 1,000 K to 1,500 K, 1,000 K to 2,000 K, 1,000 K to 2,500 K, 1,000 K to 3,000 K, 1,000 K to 3,500 K, 1,000 K to 4,000 K, 1,500 K to 2,000 K, 1,500 K to 2,500 K, 1,500 K to 3,000 K, 1,500 K to 3,500 K, 1,500 K to 4,000 K, 2,000 K to 2,500 K, 2,000 K to 3,000 K, 2,000 K to 3,500 K, 2,000 K to 4,000 K, 2,500 K to 3,000 K, 2,500 K to 3,500 K, 2,500 K to 4,000 K, 3,000 K to 3,500 K, 3,000 K to 4,000 K, or 3,500 K to 4,000 K).

In any embodiment herein, the initial crystalline seed (e.g., an initial crystalline perovskite seed) is a product arising from thermal heating of the liquid precursor by the thermal voxel.

In any embodiment herein, the crystalline material (e.g., a crystalline perovskite material) is a product arising from thermal heating of the liquid precursor by the thermal voxel Additional details follow.

Definitions

As used herein, the term "about" means +/−10% of any recited value. As used herein, this term modifies any recited value, range of values, or endpoints of one or more ranges.

By "alkaryl" is meant an aryl group, as defined herein, attached to the parent molecular group through an alkylene group, as defined herein. Other groups preceded by the prefix "alk-" are defined in the same manner. The alkaryl group can be substituted or unsubstituted. For example, the alkaryl group can be substituted with one or more substitution groups, as described herein for alkyl and/or aryl. Exemplary unsubstituted alkaryl groups are of from 7 to 16 carbons ($C_{7-16}$ alkaryl), as well as those having an alkylene group with 1 to 6 carbons and an aryl group with 4 to 18 carbons (i.e., $C_{1-6}$ alk-$C_{4-18}$ aryl).

By "alkcycloalkyl" is meant a cycloalkyl group, as defined herein, attached to the parent molecular group through an alkylene group, as defined herein. The alkcycloalkyl group can be substituted or unsubstituted. For example, the alkcycloalkyl group can be substituted with one or more substitution groups, as described herein for alkyl.

By "alkenyl" is meant an optionally substituted $C_{2-24}$ alkyl group having one or more double bonds. The alkenyl group can be cyclic (e.g., $C_{3-24}$ cycloalkenyl) or acyclic. The alkenyl group can also be substituted or unsubstituted. For example, the alkenyl group can be substituted with one or more substitution groups, as described herein for alkyl.

By "alkyl" and the prefix "alk" is meant a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic (e.g., $C_{3-24}$ cycloalkyl) or acyclic. The alkyl group can be branched or unbranched. The alkyl group can also be substituted or unsubstituted. For example, the alkyl group can be substituted with one, two, three or, in the case of alkyl groups of two carbons or more, four substituents independently selected from the group consisting of: (1) $C_{1-6}$ alkoxy (e.g., —OAk, in which Ak is an alkyl group, as defined herein); (2) $C_{1-6}$ alkylsulfinyl (e.g., —S(O)Ak, in which Ak is an alkyl group, as defined herein); (3) $C_{1-6}$ alkylsulfonyl (e.g., —$SO_2$Ak, in which Ak is an alkyl group, as defined herein); (4) amino (e.g., —$NR^{N1}R^{N2}$, where each of $R^{N1}$ and $R^{N2}$ is, independently, H or optionally substituted alkyl, or $R^{N1}$ and $R^{N2}$, taken together with the nitrogen atom to which each are attached, form a heterocyclyl group); (5) aryl; (6) arylalkoxy (e.g., —$OA^LAr$, in which $A^L$ is an alkylene group and Ar is an alkyl group, as defined herein); (7) aryloyl (e.g., —C(O)Ar, in which Ar is an alkyl group, as defined herein); (8) azido (e.g., an —N$_3$ group); (9) cyano (e.g., a —CN group); (10) carboxyaldehyde (e.g., a —C(O)H group); (11) C$_{3-8}$ cycloalkyl; (12) halo; (13) heterocyclyl (e.g., a 5-, 6-, or 7-membered ring, unless otherwise specified, containing one, two, three, or four non-carbon heteroatoms (e.g., independently selected from the group consisting of nitrogen, oxygen, phosphorous, sulfur, or halo)); (14) heterocyclyloxy (e.g., —OHet, in which Het is a heterocyclyl group); (15) heterocyclyloyl (e.g., —C(O)Het, in which Het is a heterocyclyl group); (16) hydroxyl (e.g., a —OH group); (17)N-protected amino; (18) nitro (e.g., an —NO$_2$ group); (19) oxo (e.g., an =O group); (20) C$_{3-8}$ spirocyclyl (e.g., an alkylene diradical, both ends of which are bonded to the same carbon atom of the parent group to form a spirocyclyl group); (21) C$_{1-6}$ thioalkoxy (e.g., —SAk, in which Ak is an alkyl group, as defined herein); (22) thiol (e.g., an —SH group); (23) —CO$_2$R$^A$, where R$^A$ is selected from the group consisting of (a) hydrogen, (b) C$_{1-6}$ alkyl, (c) C$_{4-18}$ aryl, and (d) C$_{1-6}$ alk-C$_{4-18}$ aryl; (24) —C(O)NR$^B$R$^C$, where each of R$^B$ and R$^C$ is, independently, selected from the group consisting of (a) hydrogen, (b) C$_{1-6}$ alkyl, (c) C$_{4-18}$ aryl, and (d) C$_{1-6}$ alk-C$_{4-18}$ aryl; (25) —SO$_2$R$^D$, where R$^D$ is selected from the group consisting of (a) C$_{1-6}$ alkyl, (b) C$_{4-18}$ aryl, and (c) C$_{1-6}$ alk-C$_{4-18}$ aryl; (26) —SO$_2$NR$^E$R$^F$, where each of R$^E$ and R$^F$ is, independently, selected from the group consisting of (a) hydrogen, (b) C$_{1-6}$ alkyl, (c) C$_{4-18}$ aryl, and (d) C$_{1-6}$ alk-C$_{418}$ aryl; and (27) —NR$^G$R$^H$, where each of R$^G$ and R$^H$ is, independently, selected from the group consisting of (a) hydrogen, (b) an N-protecting group, (c) C$_{1-6}$ alkyl, (d) C$_{2-6}$ alkenyl, (e) C$_{2-6}$ alkynyl, (f) C$_{4-18}$ aryl, (g) C$_{1-6}$ alk-C$_{4-18}$ aryl, (h) C$_{3-8}$ cycloalkyl, and (i) C$_{1-6}$ alk-C$_{3-8}$ cycloalkyl, wherein in one embodiment no two groups are bound to the nitrogen atom through a carbonyl group or a sulfonyl group. The alkyl group can be a primary, secondary, or tertiary alkyl group substituted with one or more substituents (e.g., one or more halo or alkoxy). In some embodiments, the unsubstituted alkyl group is a C$_{1-3}$, C$_{1-6}$, C$_{1-12}$, C$_{1-16}$, C$_{1-18}$, C$_{1-20}$, or C$_{1-24}$ alkyl group.

By "alkylene" is meant a multivalent form of an alkyl group, as described herein. Exemplary alkylene groups include methylene, ethylene, propylene, butylene, etc. In some embodiments, the alkylene group is a C$_{1-3}$, C$_{1-6}$, C$_{1-12}$, C$_{1-16}$, C$_{1-18}$, C$_{1-20}$, C$_{1-24}$, C$_{2-3}$, C$_{2-6}$, C$_{2-12}$, C$_{2-16}$, C$_{2-18}$, C$_{2-20}$, or C$_{2-24}$ alkylene group. The alkylene group can be in a bivalent form (e.g., —CH$_2$—) or trivalent form (e.g., —CH< or —CH=) or tetravalent form (e.g., =C= or —C—). The alkylene group can be branched or unbranched. The alkylene group can also be substituted or unsubstituted. For example, the alkylene group can be substituted with one or more substitution groups, as described herein for alkyl.

By "alkynyl" is meant an optionally substituted C$_{2-24}$ alkyl group having one or more triple bonds. The alkynyl group can be cyclic or acyclic and is exemplified by ethynyl, 1-propynyl, and the like. The alkynyl group can also be substituted or unsubstituted. For example, the alkynyl group can be substituted with one or more substitution groups, as described herein for alkyl.

By "amino" is meant —NR$^{N1}$R$^{N2}$, where each of R$^{N1}$ and R$^{N2}$ is, independently, H or optionally substituted alkyl, or R$^{N1}$ and R$^{N2}$, taken together with the nitrogen atom to which each are attached, form a heterocycle.

By "ammonium" is meant a group including a protonated nitrogen atom N$^+$. Exemplary ammonium groups include —NR$^{N1}$R$^{N2}$R$^{N3}$, where each of R$^{N1}$, R$^{N2}$, and R$^{N3}$ is, independently, H or optionally substituted alkyl; or R$^{N1}$ and R$^{N2}$, taken together with the nitrogen atom to which each are attached, form a heterocycle; or R$^{N1}$ and R$^{N2}$, taken together, form an optionally substituted alkylene or heteroalkylene (e.g., as described herein).

By "aryl" is meant a group that contains any carbon-based aromatic group including, but not limited to, benzyl, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one, two, three, four, or five substituents independently selected from the group consisting of: (1) C$_{1-6}$ alkanoyl (e.g., —C(O)Ak, in which Ak is an alkyl group, as defined herein); (2) C$_{1-6}$ alkyl; (3) C$_{1-6}$ alkoxy (e.g., —OAk, in which Ak is an alkyl group, as defined herein); (4) C$_{1-6}$ alkoxy-C$_{1-6}$ alkyl (e.g., an alkyl group, which is substituted with an alkoxy group —OAk, in which Ak is an alkyl group, as defined herein); (5) C$_{1-6}$ alkylsulfinyl (e.g., —S(O)Ak, in which Ak is an alkyl group, as defined herein); (6) C$_{1-6}$ alkylsulfinyl-C$_{16}$ alkyl (e.g., an alkyl group, which is substituted by an alkylsulfinyl group —S(O)Ak, in which Ak is an alkyl group, as defined herein); (7) C$_{1-6}$ alkylsulfonyl (e.g., —SO$_2$Ak, in which Ak is an alkyl group, as defined herein); (8) C$_{1-6}$ alkylsulfonyl-C$_{1-6}$ alkyl (e.g., an alkyl group, which is substituted by an alkylsulfonyl group —SO$_2$Ak, in which Ak is an alkyl group, as defined herein); (9) aryl; (10) amino (e.g., —NR$^{N1}$R$^{N2}$ where each of R$^{N1}$ and R$^{N2}$ is, independently, H or optionally substituted alkyl, or R$^{N1}$ and R$^{N2}$, taken together with the nitrogen atom to which each are attached, form a heterocyclyl group); (11) C$_{1-6}$ aminoalkyl (e.g., meant an alkyl group, as defined herein, substituted by an amino group); (12) heteroaryl; (13) C$_{1-6}$ alk-C$_{4-18}$ aryl (e.g., -A$^L$Ar, in which A$^L$ is an alkylene group and Ar is an alkyl group, as defined herein); (14) aryloyl (e.g., —C(O)Ar, in which Ar is an alkyl group, as defined herein); (15) azido (e.g., an —N$_3$ group); (16) cyano (e.g., a —CN group); (17) C$_{1-6}$ azidoalkyl (e.g., a —N$_3$ azido group attached to the parent molecular group through an alkyl group, as defined herein); (18) carboxyaldehyde (e.g., a —C(O)H group); (19) carboxyaldehyde-C$_{16}$ alkyl (e.g., -A$^L$C(O)H, in which A$^L$ is an alkylene group, as defined herein); (20) C$_{3-8}$ cycloalkyl; (21) C$_{1-6}$ alk-C$_{3-8}$ cycloalkyl (e.g., -A$^L$Cy, in which A$^L$ is an alkylene group and Cy is a cycloalkyl group, as defined herein); (22) halo (e.g., F, Cl, Br, or I); (23) C$_{1-6}$ haloalkyl (e.g., an alkyl group, as defined herein, substituted with one or more halo); (24) heterocyclyl; (25) heterocyclyloxy (e.g., —OHet, in which Het is a heterocyclyl group); (26) heterocyclyloyl (e.g., —C(O)Het, in which Het is a heterocyclyl group); (16) hydroxyl (e.g., a —OH group); (27) hydroxyl (e.g., a —OH group); (28) C$_{1-6}$ hydroxyalkyl (e.g., an alkyl group, as defined herein, substituted by one to three hydroxyl groups, with the proviso that no more than one hydroxyl group may be attached to a single carbon atom of the alkyl group); (29) nitro (e.g., an —NO$_2$ group); (30) C$_{1-6}$ nitroalkyl (e.g., an alkyl group, as defined herein, substituted by one to three nitro groups); (31)N-protected amino; (32)N-protected amino-C$_{1-6}$ alkyl; (33) oxo (e.g., an =O group); (34) C$_{1-6}$ thioalkoxy (e.g., —SAk, in which Ak is an alkyl group, as defined herein); (35) thio-C$_{1-6}$ alkoxy-C$_{1-6}$ alkyl (e.g., an alkyl group, which is substituted by an thioalkoxy group —SAk, in which Ak is an alkyl group, as defined herein); (36) —(CH$_2$)$_r$CO$_2$R$^A$, where r is an integer of from zero to four, and R$^A$ is selected from the group consisting of (a) hydrogen, (b) C$_{1-6}$ alkyl, (c) C$_{4-18}$ aryl, and (d) C$_{1-6}$ alk-C$_{4-18}$ aryl; (37) —(CH$_2$)$_r$CONR$^B$R$^C$, where r is an integer of from zero to four and where each R$^B$ and R$^c$ is independently selected from the group consisting of (a) hydrogen, (b) C$_{1-6}$ alkyl, (c) C$_{4-18}$ aryl, and (d) C$_{1-6}$ alk-C$_{4-18}$ aryl; (38) —(CH$_2$)$_r$SO$_2$R$^D$, where r is an integer of from zero to four and where R$^D$ is selected from the group consisting of (a) C$_{1-6}$ alkyl, (b) C$_{4-18}$ aryl, and (c) C$_{1-6}$ alk-C$_{4-18}$ aryl; (39) —(CH$_2$)$_r$SO$_2$NR$^E$R$^F$, where r is an integer of from zero to four and where each of R$^E$ and R$^F$ is, independently, selected from the group consisting of (a) hydrogen, (b) C$_{1-6}$ alkyl, (c) C$_{4-18}$ aryl, and (d) C$_{1-6}$ alk-C$_{4-18}$ aryl; (40) —(CH$_2$)NR$^G$R$^H$, where r is an integer of from zero to four and where each of R$^G$ and R$^H$ is, independently, selected from the group consisting of (a) hydrogen, (b) an N-protecting group, (c) C$_{1-6}$ alkyl, (d) C$_{2-6}$ alkenyl, (e) C$_{2-6}$ alkynyl, (f) C$_{4-18}$ aryl, (g) C$_{1-6}$ alk-C$_{4-18}$ aryl, (h) C$_{3-8}$ cycloalkyl, and (i) C$_{1-6}$ alk-C$_{3-8}$ cycloalkyl, wherein in one embodiment no two groups are bound to the nitrogen atom through a carbonyl group or a sulfonyl group; (41) thiol; (42) perfluoroalkyl (e.g., an alkyl group, as defined herein, having each hydrogen atom substituted with a fluorine atom); (43) perfluoroalkoxy (e.g., —OR$^f$, in which R$^f$ is an alkyl group, as defined herein, having each hydrogen atom substituted with a fluorine atom); (44) aryloxy (e.g., —OAr, where Ar is an optionally substituted aryl group, as described herein); (45) cycloalkoxy (e.g., —OCy, in which Cy is a cycloalkyl group, as defined herein); (46) cycloalkylalkoxy (e.g., —OA$^L$Cy, in which A$^L$ is an alkylene group and Cy is a cycloalkyl group, as defined herein); and (47) arylalkoxy (e.g., —OA$^L$Ar, in which A$^L$ is an alkylene group and Ar is an alkyl group, as defined herein). In particular embodiments, an unsubstituted aryl group is a C$_{4-18}$, C$_{4-14}$, C$_{4-12}$, C$_{4-10}$, C$_{6-18}$, C$_{6-14}$, C$_{6-12}$, or C$_{6-10}$ aryl group.

By "cycloalkyl" is meant a monovalent saturated or unsaturated non-aromatic cyclic hydrocarbon group of from three to eight carbons, unless otherwise specified, and is exemplified by cyclopropyl, cyclobutyl, cyclopentyl, cyclohexyl, cycloheptyl, bicyclo[2.2.1.]heptyl and the like. The cycloalkyl group can also be substituted or unsubstituted. For example, the cycloalkyl group can be substituted with one or more groups including those described herein for alkyl.

By "halide anion" is meant negatively charged halogen.

By "halogen" is meant F, Cl, Br, or I.

By "heteroalkylene" is meant a divalent form of an alkylene group, as defined herein, containing one, two, three, or four non-carbon heteroatoms (e.g., independently selected from the group consisting of nitrogen, oxygen, phosphorous, sulfur, or halo).

By "micro" is meant having at least one dimension that is less than 1 mm. For instance, a microstructure (e.g., any structure described herein) can have a length, width, height, cross-sectional dimension, circumference, radius (e.g., external or internal radius), or diameter that is less than 1 mm.

By "nano" is meant having at least one dimension that is less than 1 m. For instance, a nanostructure (e.g., any structure described herein) can have a length, width, height, cross-sectional dimension, circumference, radius (e.g., external or internal radius), or diameter that is less than 1 m.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

BRIEF DESCRIPTION OF THE DRAWINGS

As seen in FIG. 1B, platinum (Pt) crosses are patterned onto a glass substrate and immersed in precursor solution. The backside of the Pt metal is heated to induce crystallization, in this example, of CH$_3$NH$_3$PbBr$_3$ perovskite. Also provided is an optical image of a crystalline CH$_3$NH$_3$PbX$_3$ material formed by positioning a thermal voxel in proximity to the absorber region (FIG. 1C).

DETAILED DESCRIPTION OF THE INVENTION

The present invention relates to methods, as well as systems implementing such methods, for direct write fabrication of a crystalline material. The methods rely on applying a thermal voxel within a liquid precursor, which results in the formation of an initial crystalline seed. This seed, in turn, can be used to initiate further crystal growth or to promote crystal dissolution, thereby providing a crystalline material.

Figure 1A:
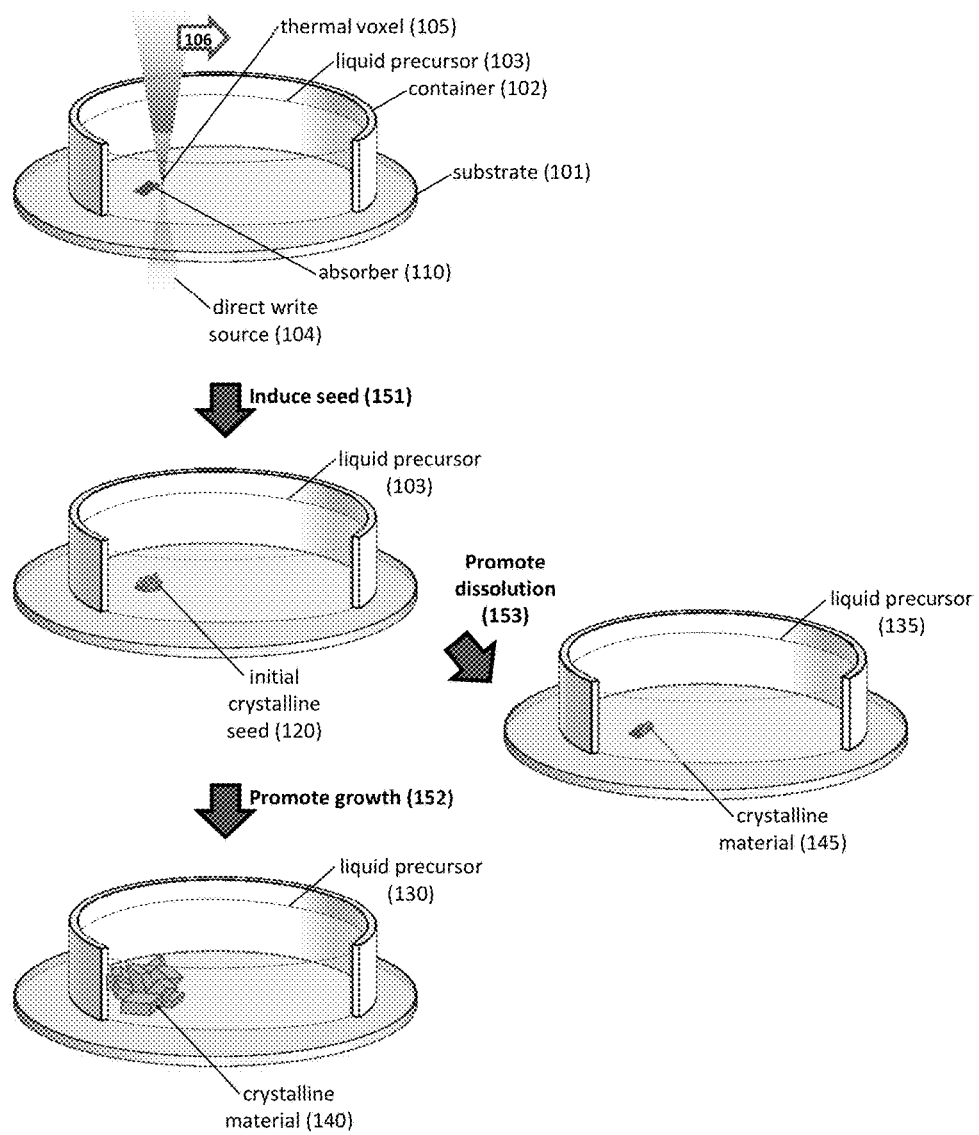
FIG. 1A-1C shows an exemplary method for direct writing of a crystalline material by using a thermal voxel. Provided are schematics of an exemplary process employing a direct write source 104 to provide a thermal voxel 105 in proximity to a substrate 101 and a liquid precursor 103 (FIG. 1A) and of a further exemplary process employing an absorber region (e.g., laser deposited platinum crosses) to form a crystalline material (e.g., CH$_3$NH$_3$PbX$_3$, in which X is a halide) (FIG. 1B).

FIG. 1A provides an exemplary method, which includes inducing 151 an initial crystalline seed, promoting crystal growth 152 of the seed, and/or promoting crystal dissolution 153 of the seed. In one instance, seed nucleation (or induction) is confined to a heated, three-dimensional reaction volume, i.e., a thermal voxel 105. In one instance, the initial crystalline seed is formed from a liquid precursor (including one or more precursor(s) and solvent) that provides conditions for inverse temperature crystallization or inverse temperature solubility (e.g., liquid precursors, in which solute solubility decreases with increasing temperature). Any useful direct write source 104 can be employed to provide the thermal voxel 105. In one instance, if the direct write source is a laser source, then the thermal voxel is positioned at the focal point of the laser. Other direct write sources can be employed, e.g., any described herein.

An initial crystalline seed can be formed in any useful manner. As also seen in FIG. 1A, the thermal voxel 105 is formed in the presence of a liquid precursor 103, which provides the reactant(s) that form the initial crystalline seed 120. The liquid precursor can be confined by any useful container 102 and any useful substrate 101. The substrate can be chosen to be any useful material that is transparent at least a portion of the electromagnetic spectrum delivered by the direct write source. In addition, the substrate can include an absorber region 110.

Translation 106 of the thermal voxel results in a patterned seed structure. Arbitrary structures including crystalline seeds can be formed by translating the thermal voxel to various positions on the substrate. The thermal voxel can be translated, with respect to a position on the substrate, in any useful manner. For instance, either the direct write source can be translated or the substrate can be translated. At each position, the thermal voxel can be maintained at a sufficient dwell time to allow the nucleation reaction to occur before moving to another position.

A thermal voxel is provided when a volume of the liquid precursor sufficiently absorbs a portion of the electromagnetic spectrum provided by the direct write source, and in which this absorption provides a sufficient thermal gradient to facilitate a solvothermal reaction. Thus, in one non-limiting embodiment, if the precursor reagent sufficiently absorbs the direct write source, then an absorber region is not required. In another non-limiting embodiment, fabrication using thermal voxels begins by providing an optically absorbing structure (e.g., an absorber region 110 in proximity to a liquid precursor 103, as in FIG. 1A; or an absorber film 210 in proximity to a liquid precursor, as in FIG. 2A).

After forming the initial crystalline seed, the method can further include promoting crystal growth and/or crystal dissolution of the seed, thereby providing a crystalline material that is patterned upon the substrate. As seen in FIG. 1A, the method can further include promoting crystal growth 152 of the seed 120, thereby providing a crystalline material 140. Crystal growth can be conducted in the presence of a liquid precursor 130, which can be a solution for promoting seed nucleation and/or crystal growth. As also seen FIG. 1A, the method can further include promoting crystal dissolution 153 of the seed 120, thereby providing a crystalline material 145. Crystal dissolution can be conducted in the presence of a liquid precursor 135, which can be a solution for promoting crystal dissolution.

Figure 1B:
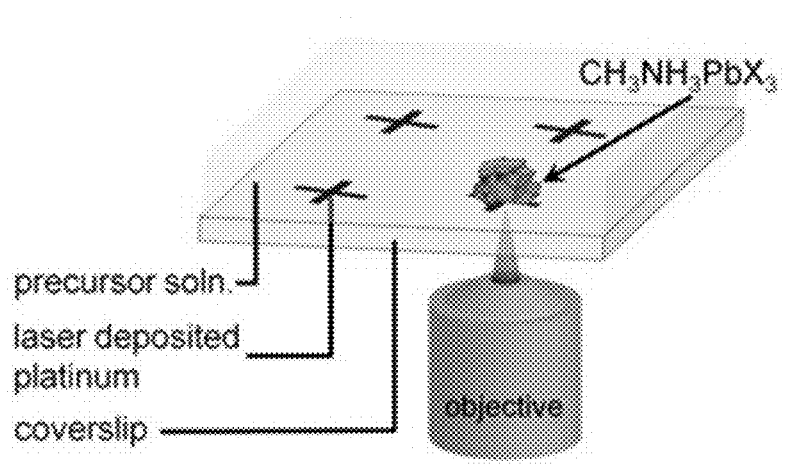

As seen in FIG. 1B, an exemplary method includes providing an absorber (e.g., laser deposited platinum) disposed on a substrate (e.g., a coverslip), and then rinsing the substrate in a precursor solution (an aqueous solution containing a precursor reagent). By irradiating the edge of the absorber with a laser (e.g., a tightly focused continuous wave laser), a thermal voxel is formed from the induced thermal gradient. Interaction between the thermal voxel and the liquid precursor provides an initial crystalline seed (e.g., as in FIG. 1C), and this nascent seed then provides crystal surface(s) for further growth.

Any useful absorber (e.g., a patterned absorber region or a deposited absorber film) can be employed to increased absorption of the direct write source, as compared to the substrate's material and/or to the liquid precursor. Exemplary absorbers include optically opaque materials, such as metals (e.g., including oxides thereof), graphitic carbon (e.g., carbon), as well as composites and multilayers thereof. For instance, the absorber can be a patterned material (e.g., an absorber region in FIG. 1A) or a deposited film (e.g., an absorber film in FIG. 2A).

Figure 2A:
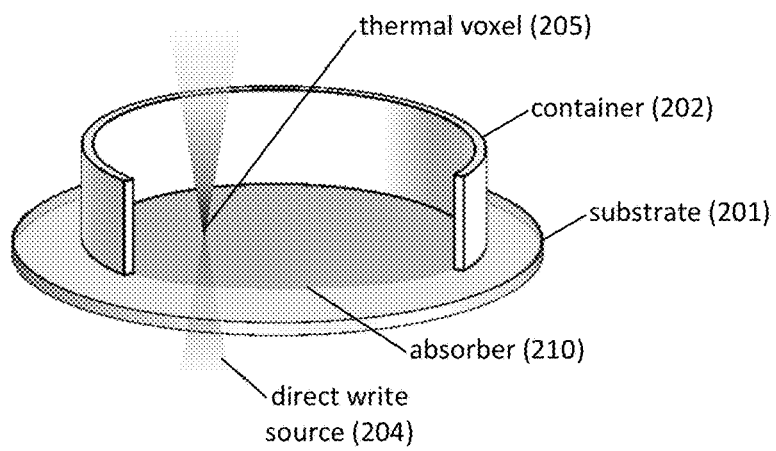
FIG. 2A-2D shows another exemplary method for direct writing of a crystalline material by using a thermal voxel. Provided are schematics of an exemplary process employing a direct write source 204 to provide a thermal voxel 205 in proximity to a substrate 201 having an absorber film 210 (FIG. 2A) and of a further exemplary process employing an absorber film (e.g., sputter film of a metal or carbon) to form a crystalline material (e.g., CH$_3$NH$_3$PbX$_3$, in which X is a halide) (FIG. 2B). Also provided is an optical image of a crystalline CH$_3$NH$_3$PbX$_3$ material formed by translating a thermal voxel in an arbitrary pattern (FIG. 2C). Thermal simulation (COMSOL) was conducted to understand the temperature gradient induced via 1 mW of focused laser illumination on the sputtered film (FIG. 2D).
Figure 2B:
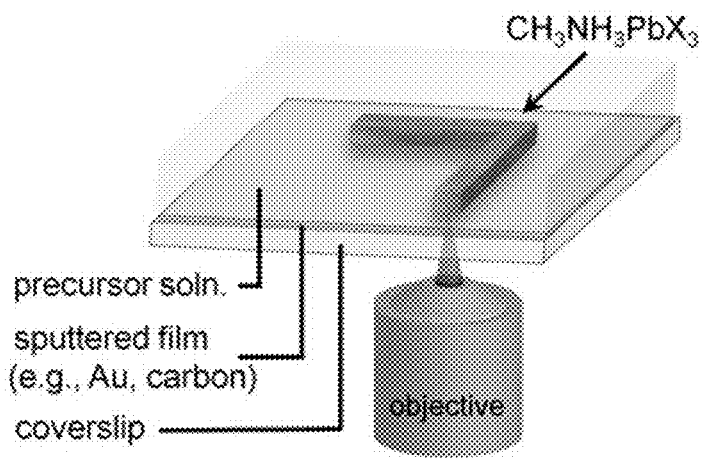
Figure 2C:
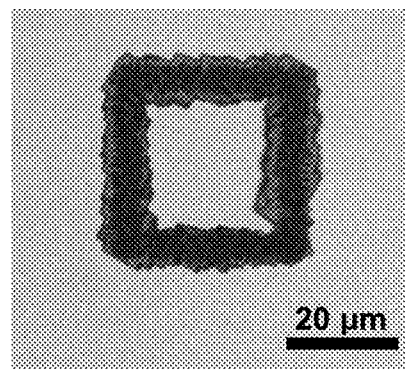

As seen in FIG. 2A, translation of the thermal voxel 205 upon the absorber film 210 enables an initial crystalline seed to be patterned arbitrarily in x-, y-, and/or z-coordinates. The thermal voxel 205 can be translated by moving either the substrate 201 or the direct write source 204. Any useful container 202 can be employed to confine the liquid precursor in proximity to the absorber film 210. FIG. 2B provides a non-limiting method, in which a substrate (e.g., a coverslip) includes an absorber film (e.g., a sputtered film, including Au, C, or graphitic carbon) and a precursor solution (e.g., an aqueous solution containing a precursor reagent for a perovskite, such as for a lead halide perovskite) is in proximity to the absorber film. By irradiating a region of the absorber film with a laser (e.g., a tightly focused continuous wave laser), a thermal voxel is formed, and the interaction between the thermal voxel and the liquid precursor provides an initial crystalline seed. By translating the thermal voxel, a patterned initial crystalline seed can be formed (FIG. 2C).

The initial crystalline seed can be formed with any useful nucleation reaction involving an increased pressure and/or temperature. Increased pressure includes a pressure greater than ambient pressure (e.g., atmospheric pressure), such as a pressure greater than about $10^5$ Pa (e.g., of from about $10^6$ Pa to about $10^9$ Pa) or an autogenous pressure (e.g., pressure induced by other conditions, such as increasing reaction temperature); and increased temperature includes a temperature greater than ambient temperature (e.g., room temperature), such as a temperature equal to or greater than any useful baseline temperature (e.g., ambient temperature, such as room temperature), such as a temperature less than or equal to or greater than about 300 K (e.g., of from about 300K to about 2500 K).

Exemplary nucleation reactions include those involving inverse temperature solubility or retrograde solubility, in which an increase in temperature results in the formation of a crystalline seed. Without wishing to be limited by mechanism, in some solute and solvent combinations, an increase in temperature can result in solvent exclusion, thereby initiating crystalline seed formation; and/or result in an exothermic dissolution reaction, which promotes reactant precipitation; and/or result in a phase change, thereby providing a discontinuous solubility curve, in which retrograde solubility is observed within a particular temperature range. Arrays of such seeds can be formed by providing an array of absorber regions (e.g., as in FIG. 3) or by patterning an array of initial crystalline seeds.

Experimental conditions within the thermal voxel can be controlled in any useful manner. For instance, the temperature of the reaction zone is determined, in part, by the extent of absorption (by the liquid precursor or by the absorber) for the emitted electromagnetic radiation of the direct write source. Thus, temperature can be controlled by choosing a liquid precursor or absorber having a particular absorption, by selecting a wavelength of the direct write source having a desired absorption spectrum (by the liquid precursor and/or by the nascent deposited material), and/or by providing a continuous wave source for constant supply of the thermal gradient. In another instance, temperature can be controlled by the size of the focused region provided by the direct write source (e.g., for a laser, the size can include a dimension of the focused laser spot). In yet another instance, the thermal conductivity of the substrate can be selected to provide the desired temperature rise.

Nucleation of the crystalline seed and subsequent crystal growth can be controlled in any useful manner. In one instance, thermal diffusion may also play a role, in which a generated thermal gradient can be maintained in any useful manner. In another instance, the size of the initial crystalline seed may play a role, in which crystal dissolution can be related to the concentration of the precursor(s) within the liquid precursor (see, e.g., FIG. 6B). In yet another instance, crystal growth conditions may also play a role, in which crystal growth can be related to dwell time and/or the concentration of the precursor(s) within the liquid precursor (see, e.g., FIG. 6A).

The dwell time of the thermal voxel is understood to be a time for which the direct write source is maintained at a particular position in proximity to the substrate. By increasing the dwell time, a constant source of thermal energy is provided at that particular position; and the dwell time can be selected to sufficiently result in an initial crystalline seed at that particular position. Chemical and physical characteristics of the liquid precursor can also play a role, in which the concentration, viscosity, and/or heat capacity of the liquid precursor can be selected to provide desired thermal properties.

Multidimensional structures (e.g., two-dimensional or three-dimensional structures) can be formed. If desired, scaffolds can be employed to during printing. Optionally, such scaffolds can be removed to after printing to provide a printed structure. In some embodiments, the scaffold can be maintained in the final structure. Such scaffolds can be useful for mechanical support when printing three-dimensional structures or nano-scaled features, as well as for providing an absorber to initiate formation of a thermal voxel. Exemplary scaffolds include an optically transparent scaffold (e.g., that can be removed after printing) or an absorbing scaffold. Exemplary scaffolds include those formed from a hydrogel, a sol gel, an aerogel, a ceramic, a xerogel, a protein gel (e.g., including gelatin or a serum protein), a saccharide (e.g., including alginate or agar), etc.

Any useful structure can be printed. Exemplary structures include nanostructures (e.g., nanowires, nanotubes, nanorods, nanocomposites, or nanoparticles), microstructures (e.g., microparticles, microplates, or microspheres), perovskites, metal-organic framework structures, zeolites, organic-inorganic hybrid materials, ceramics, metal, metal oxides, metallic glasses, magnetic structures, particles (e.g., quantum dots), wires, photonic structures (e.g., waveguides), crystals (e.g., photonic crystals or electromagnetic bandgap crystals), crystallites, metamaterials (e.g., mechanical materials, optical metamaterials, or electromagnetic bandgap materials), elemental carbon structures (e.g., carbon nanotubes, fullerenes, or graphitic carbon materials, such as a graphene, a graphite, a non-graphitic carbon materials, as well as allotropes of such materials), as well as alloys thereof (e.g., metal alloys and shape memory alloys)

and/or arrays thereof and/or composites thereof. Such printed structures can have any use (e.g., such as those described herein, including custom metal parts, electronics (e.g., transistors or antennas), optoelectronics, photovoltaic devices (e.g., photovoltaic cells), displays, sensors, etc., with ultrahigh resolution for industrial and/or consumer product markets). Additional structures and uses are described in Arnold C B et al., "Laser direct-write techniques for printing of complex materials," *MRS Bull.* 2007; 32:23-31, which is incorporated herein by reference in its entirety.

Liquid Precursor and Absorber Material

The present invention employs a liquid precursor to provide precursor reagents for the initial crystalline seed that is induced within the thermal voxel. In general, the liquid precursor includes a solvent and one or more precursor reagents. Any useful solvent and reagents may be employed (e.g., any described herein), and optional additives may be included to control morphology, oxidation site, pore size, ligand coordination, encapsulated agents, etc.

For any of the methods herein, the liquid precursor can be optimized for the inducing step and/or the promoting step. In one instance, the initial crystalline seed is formed in a first liquid precursor that is optimized for forming the seed, and crystal growth is formed in a second liquid precursor that is optimized for growing the seed into a crystalline material. In another instance, the initial crystalline seed is formed in a first liquid precursor that is optimized for forming the seed, and crystal dissolution is conducted in a second liquid precursor that is optimized for dissolving the seed into a crystalline material. The first and second liquid precursors can be same or different. Different liquid precursors can include those having different precursor reagents, the same precursor reagents available at a different concentration, or a change in solvent or solvent mixture. For instance, the first liquid precursor can be formed in a solvent system (including one or more solvents) that provides retrograde solubility of the solute, but the second liquid precursor can be formed in a second solvent system that provides high quality crystal growth. In another instance, that second liquid precursor can be formed in a solvent system and/or a precursor concentration range that provides controlled crystal dissolution.

Exemplary solvents include water, an aqueous solution, a buffer, an electrolyte solution (e.g., a salt solution), an ionic liquid, an organic solvent (e.g., a polar aprotic solvent, a nonpolar solvent, a cosolvent, etc., such as N,N-dimethylformamide (DMF), dimethyl sulfoxide (DMSO), γ-butyrolactone (GBL), N-methyl-2-pyrrolidone (NMP), 1,8-diiodooctane (DIO), chlorobenzene (ClBz), 1-octadecene (ODE), toluene, tetrahydrofuran (THF), etc.), and a fluorous solvent (e.g., a perfluorinated solvent), as well as mixtures thereof. The precursor liquid can include any useful additive, such as coordinating ligands (e.g., fatty acid ligands), surfactants (e.g., oleic acid and oleylamine), etc.

The liquid precursor can include any useful combination of one or more precursor reagents and solvents. The liquid precursor can be optimized to possess inverse temperature solubility or inverse retrograde solubility, in which exposure to a higher temperature results in a lower solubility and in the formation of an initial crystalline seed. In one non-limiting instance, for controlled dissolution in a reaction characterized by inverse temperature solubility, a decrease in temperature can provide controlled dissolution of the crystalline seed.

The initial crystalline seed and/or the crystalline material can include any useful material, such as an organometallic material. Exemplary organometallic material includes those having the formula $ABX_3$, $A_2BX_4$, $A_4BX_6$, or $A_4B_3X_{10}$, in which each A, independently, includes a cation, an organic moiety, or an alkali metal; each B, independently, includes a metal; and each X, independently, includes a halogen (e.g., each A, B, and X in each formula can be the same or different; B is a metal cation, X is a halide (i.e., a halogen anion)). Such materials can include mixed halide formulas, in which the material includes a mixture of two or more halides within a crystal structure, e.g., $CH_3NH_3PbBr_xCl_{3-x}$ ($MAPbBr_xCl_{3-x}$), as well as others described herein.

Exemplary organometallic materials include $CH_3NH_3PbI_3$ ($MAPbI_3$), $CH_3NH_3PbBr_3$ ($MAPbBr_3$), $CH_3NH_3PbCl_3$ ($MAPbCl_3$), $CH_3NH_3PbBr_xCl_{3-x}$ ($MAPbBr_xCl_{3-x}$), $CH_3NH_3PbBr_xI_{3-x}$ ($MAPbBr_xI_{3-x}$), $CH_3NH_3PbCl_xI_{3-x}$ ($MAPbBr_xI_{3-x}$), $HC(NH_2)_2PbI_3$ ($FAPbI_3$), $HC(NH_2)_2PbBr_3$ ($FAPbBr_3$), $HC(NH_2)_2PbCl_3$ ($FAPbCl_3$), $CH_3NH_3SnBr_3$ ($MASnBr_3$), $CH_3NH_3SnI_3$ ($MASnI_3$), $CH_3NH_3SnCl_3$ ($MASnCl_3$), $CH_3NH_3SnBr_xCl_{3-x}$ ($MASnBr_xCl_{3-x}$), $CH_3NH_3SnBr_xI_{3-x}$ ($MASnBr_xI_{3-x}$), $CH_3NH_3SnCl_xI_{3-x}$ ($MASnBr_xI_{3-x}$), $HC(NH_2)_2SnI_3$ ($FASnI_3$), $HC(NH_2)_2SnBr_3$ ($FASnBr_3$), $HC(NH_2)_2SnCl_3$ ($FASnCl_3$), $CH_3NH_3Pb_{1-x}Sn_xI_3$ ($MAPbSnI_3$), $CsSnI_3$, and $CsSnI_{3-x}Br_x$, in which x is of from about 0.1 to about 2.9 (e.g., 0.1, 0.2, 0.25, 0.3, 0.4, 0.5, 0.6, 0.7, 0.75, 0.8, 1.2, 1.8, 2.0, 2.25, or 2.5).

The liquid precursor can include one or more precursor reagents and one or more solvent, which in turn can produce the crystalline material. Exemplary precursor reagents include $AX^1_m$, $BX^2_n$, $AY_m$, and/or $BY_n$, in which each of m and n is, independently, a number of from about 1 to 5; A includes an organic moiety, a cationic moiety, or an alkaline metal; B includes a metal (e.g., a divalent metal); each of $X^1$ and $X^2$, independently, includes a halogen (e.g., a halide); and Y include a leaving group. In some embodiments, a reaction between two or more of the precursor reagents produces the seed and/or the crystalline material having any useful formula (e.g., a formula of $ABX^1_3$, $ABX^2_3$, or $ABX^1_aX^2_b$, in which a+b=3). Non-limiting, exemplary reactions include the following: $AX+BX_2 \rightarrow ABX_3$; $AX^1+BX^2_2 \rightarrow ABX^1X^2_2$; $AX^1+BX^2_2 \rightarrow ABX^1X^2_2$; $AY+BY_2+3HX \rightarrow ABX_3+3HY$; and $2A^*+2YR^Y+3BX_2 \rightarrow 2ABX3+BY$, in which $A=A^*R^Y$, where $A^*$ is a cationic precursor (e.g., an amino, as defined herein), $R^Y$ is H or optionally substituted alkyl, such that a binding reaction between $A^*$ and $R^Y$ provides a cationic moiety (e.g., an ammonium, as defined herein), where each of A, B, X, $X^1$, $X^2$, and Y, independently, can be any described herein.

In any of the precursor reagents and crystalline material herein, the formula can include any useful combination of A, B, X (e.g., $X^1$ or $X^2$), and Y (e.g., any described herein). Exemplary A includes an organic moiety, such as a quaternary amine, e.g., $R^1NH_{3+}$ or $(NR^{1a}R^{1b})R^2(NR^{1a}R^{1b})^+$ in which each of $R^1$, $R^{1a}$, and $R^{1b}$ is, independently, selected from the group consisting of H, optionally substituted $C_{1-24}$ alkyl, optionally substituted $C_{2-24}$ alkenyl, optionally substituted $C_{3-24}$ cycloalkyl, optionally substituted $C_{4-18}$ aryl, optionally substituted $C_{1-24}$ alk-$C_{4-18}$ aryl, and optionally substituted $C_{1-24}$ alk-$C_{324}$ cycloalkyl, and in which $R^2$ is an optionally substituted $C_{1-24}$ alkylene (e.g., $CH_3NH_{3+}$, $HC(NH_2)_2^+$, or $CH_3CH_2NH_3^+$); a cation (e.g., having a diameter larger than B); or an alkali metal (e.g., $Rb^+$ or $Cs^+$). Exemplary B includes a metal (e.g., lead, germanium, or tin), including metal cations (e.g., $Pb^{2+}$, $Ge^{2+}$, or $Sn^{2+}$ or divalent metals. Exemplary X includes halogen (e.g., a halide, such as $Cl^-$, $Br^-$, or $I^-$) or other anions, such as tetrafluoroborate anion ($BF_4^-$), hexafluorophosphate anion ($PF_6^-$), sulfate anion ($SO_4^{2-}$), carbonate anion ($CO_3^{2-}$), and hydroxide anion ($OH^-$). Exemplary precursor reagents include those containing an organic moiety, such as $CH_3NH_3X$ and $CH_3NH$, in which X is halo; as well as those containing a metal, such as $PbX_3$ and $Pb(CH_3COOH)_2$, X is halo.

An absorber region or film can be formed from any useful material, such as a metal (e.g., a transition metal element, such as titanium (Ti), zirconium (Zr), vanadium (V), chromium (Cr), molybdenum (Mo), tungsten (W), manganese (Mn), iron (Fe), ruthenium (Ru), cobalt (Co), rhodium (Rh), iridium (Ir), nickel (Ni), palladium (Pd), platinum (Pt), copper (Cu), silver (Au), gold (Ag), and zinc (Zn); or other metals, such as aluminum (Al), indium (In), and lead (Pb)), an inorganic element (e.g., a metalloid element, such as silicon (Si)), a graphite source (e.g., graphitic carbon, graphite, or graphene), an elemental carbon source (including allotropes thereof, such as various forms of graphitic carbon materials and non-graphitic carbon materials, or allotropes thereof), or salts, oxides, phosphates, hydroxides, hydrates, solvates, and/or mixtures thereof.

Further exemplary precursor reagents, solvents, and/or liquid precursors are described in An B W et al., "Direct printing of reduced graphene oxide on planar or highly curved surfaces with high resolutions using electrohydrodynamics," *Small* 2015; 11(19):2263-8; Ahmad S et al., "Direct deposition strategy for highly ordered inorganic organic perovskite thin films and their optoelectronic applications," *Opt. Mater. Express* 2014; 4(7):1313-23; Alias M S et al, "Enhanced Etching, surface damage recovery, and submicron patterning of hybrid perovskites using a chemically gas-assisted focused-ion beam for subwavelength grating photonic applications," *J. Phys. Chem. Lett.* 2016; 7:137-42; Dong W J et al., "Ultrafast laser-assisted synthesis of hydrogenated molybdenum oxides for flexible organic solar cells," *J. Mater. Chem. A* 2016; 4:4755-62; Dwivedi V K et al., "Direct deposition of inorganic-organic hybrid semiconductors and their template-assisted microstructures," *Mater. Chem. Phys.* 2013; 137:941-6; Feng J et al., "'Liquid knife' to fabricate patterning single-crystalline perovskite microplates toward high-performance laser arrays," *Adv. Mater.* 2016; 28(19):3732-41; In J B et al., "Laser crystallization and localized growth of nanomaterials for solar applications," *Proc. SPIE* 2013; 8826:88260E (5 pp.); Kanaujia P K et al., "Laser-induced microstructuring of two-dimensional layered inorganic-organic perovskites," *Phys. Chem. Chem. Phys.* 2016; 18:9666-72; Kim K et al., "3D optical printing of piezoelectric nanoparticle-polymer composite materials," *ACS Nano* 2014; 8(10):9799-806; Liu Y et al., "Two-inch-sized perovskite $CH_3NH_3PbX_3$ (X=Cl, Br, I) crystals: growth and characterization," *Adv. Mater.* 2015; 27:5176-83; Niu G et al., "Review of recent progress in chemical stability of perovskite solar cells," *J. Mater. Chem. A* 2015; 3:8970-80; Niu L et al., "Controlled synthesis of organic/inorganic van der Waals solid for tunable light-matter interactions," *Adv. Mater.* 2015; 27(47):7800-8; Saidaminov M I et al., "High-quality bulk hybrid perovskite single crystals within minutes by inverse temperature crystallization," *Nature Commun.* 2015; 6:7586 (6 pp.); Saliba M et al., "Structured organic-inorganic perovskite toward a distributed feedback laser," *Adv. Mater.* 2016; 28:923-9; Sum T C et al., "Advancements in perovskite solar cells: photophysics behind the photovoltaics," *Energy Environ. Sci.* 2014; 7:2518-34; Wang G et al., "Wafer-scale growth of large arrays of perovskite microplate crystals for functional electronics and optoelectronics," *Sci. Adv.* 2015; 1(9): e1500613 (9 pp.); and Zhu H et al., "Lead halide perovskite nanowire lasers with low lasing thresholds and high quality factors," *Nature Mater.* 2015; 14:636-42, each of which is incorporated herein by reference in its entirety.

The composition and delivery of the liquid precursor can be optimized to provide deposited seeds or crystalline materials having a different composition. In one instance, the liquid precursor can include multiple precursor reagents, in which a nucleation reaction between the agents provides a seed or crystalline material with multiple chemical elements. In another instance, a first liquid precursor can have one or more precursor reagents to deposit a first structure (e.g., seed or crystalline material), and then a second liquid precursor can be provided to deposit further chemical elements within, above, or in proximity to the first structure.

The liquid precursor can include one or more additives. Exemplary additives include one or more surfactants (e.g., a cationic surfactant, such as a quaternary ammonium salt like a $C_{10-20}$ alkyltrimethylammonium halide or cetyltrimethylammonium bromide; a non-ionic surfactant, such as a polyethylene oxide-based compounds, including Triton™ X-114), ligands (e.g., phosphoric acids), ions (e.g., fluoride ions), salts (e.g., lithium, potassium, or sodium), acids (e.g., nitric acid), bases (e.g., ammonium hydroxide), sensitizers, dyes (e.g., methylene blue, infrared dyes, near-infrared dyes, etc.), reducing agents (e.g., a polyol), oxidizing agents, stabilizing agents, chelating agents, polymers (e.g., polyvinylpyrrolidone (PVP)), and/or hydrogels.

Upon thermal heating, the liquid precursor reacts to produce the deposited seed or crystalline material, which can be further heated (or annealed). Any useful deposited material can be formed using the methods herein. Exemplary deposited materials can include organometallic crystalline structures for any useful purpose including diverse electronic and optoelectronic systems, such as transistors, dye-sensitized solar cells, planar heterojunction devices, organic photovoltaics, semiconductor-sensitized or extremely thin absorber solar cells, meso-superstructured solar cells, light emitting diodes, photodetectors, laser diodes, or lasers.

Devices including such organometallic crystalline structures can also include further functional structures, such as a hole transport layer including, e.g., 2'-7,7'-tetrakis(N,N-di-p-methoxyphenylamine)-9,9'-spirobifluorene (spiro-OMeTAD), nickel oxide ($NiO_x$), $MoO_3$, a tetrathiafulvalene derivative (e.g., TTF-1 having a $C_{18}$ tail), poly(3-hexylthiophene) (P3HT), poly [2-methoxy-5-(2-ethylhexyloxy)-1,4-phenylenevinylene] (MEH-PPV), poly [2,6-(4,4-bi s-(2-ethylhexyl)-4H-cyclopenta[2,1-b;3,4-b']dithiophene)-alt-4,7(2,1,3-benzothiadiazole)](PCPDTBT), poly [2-methoxy-5-(3',7'-dimethyloctyloxy)-1,4-phenylenevinylene] (MDMO-PPV), poly [N-9'-heptadecanyl-2,7-carbazole-alt-5,5-(4',7'-di-2-thienyl-2',1',3'-benzothiadiazole)] (PCDTBT), poly({4,8-bis[(2-ethylhexyl)oxy]benzo[1,2-b:4,5-b']dithiophene-2,6-diyl} {3-fluoro-2-[(2-ethylhexyl)carbonyl]thieno[3,4-b] thiophenediyl}) (PTB7), PBDTTPD (a copolymer between 1,3-dibromo-5-octylthieno[3,4-c]pyrrole-4,6-dione and di(2-ethylhexyloxy)benzodithiophene distannane monomers), poly-(triarylamine) (PTAA), or poly(3,4-ethylenedioxythiophene)/polystyrene sulfonate (PEDOT/PSS); an electron transport layer (a hole blocking layer) including, e.g., fullerene [phenyl-$C_{61}$-butyric acid methyl ester ($PC_{61}BM$)], fullerene [phenyl-$C_{71}$-butyric acid methyl ester ($PC_{71}BM$)], bathocuproine (BCP), indene-$C_{60}$ bisadduct (ICBA), $TiO_2$, ZnO, $Sb_2S_3$, or $SnO_2$; an n-type layer including, e.g., $TiO_2$ or ZnO; a p-type layer including, e.g., NiOx or PEDOT; a cathode buffer layer including, e.g., $TiO_2$, ZnO, $SnO_x$, titanium (IV) oxide bis(2,4-pentanedionate) (TOPD), titanium (diisopropoxide) bis(2,4-pentanedionate) (TIPD), or zirconium acetylacetonate (ZrAcac); an anode buffer layer including, e.g., $MoO_3$, $V_2O_5$, $WO_3$, $NiO_x$, $ReO_3$, or CuOx; a modification layer including, e.g., $Sb_2S_3$; an optical spacer layer including, e.g., $TiO_x$, ZnO, $V_2O_5$, or ZrAcac; an electrode including, e.g., Au, Ag, or Al (e.g., as a top metal electrode); or a conducting film including, e.g., indium tin oxide (ITO), fluorine doped tin oxide (FTO) optionally with $TiO_2$ (e.g., as a transparent electrode).

Direct Write Sources

The present invention can include the use of a direct write source to provide electromagnetic radiation, which in turn provides a thermal gradient or a thermal voxel. Exemplary direct write sources include a laser (e.g., a solid-state laser, a semiconductor laser, a diode laser, a fiber laser, etc.). Such direct write source can have any useful operating wavelength, such as of from about 500 nm to about 1,000 nm or in the ultraviolet, visible, near-infrared, or infrared wavelengths (e.g., a Ti:sapphire laser operating at about 750 nm; or a Nd:YAG laser operating at 1064 nm or 532 nm). In one instance, the direct write source is a continuous wave laser source wavelength of from about 500 nm to about 1,000 nm. In another instance, the direct write source is a heated micromachined tip (e.g., a heated atomic force microscopy (AFM) tip or a heated scanning tunneling microscopy (STM) tip, which is heated by an electron-beam).

A direct write source can be used in conjunction with a mask, such as an optical mask or a light modulator. Exemplary light modulators include a liquid crystal module (LCM, such as a liquid crystal display LCD, including a transmission LCD or a reflection LCD) or a digital micromirror device (DMD), optionally including a polarizing element (e.g., a polarizing mirror) or a diffraction grating (e.g., an amplitude grating).

Systems

The present invention also relates to systems configured to implement the methods described herein. Such systems can have any useful components to provide and translate the thermal voxel to produce the desired printed structure. Exemplary components include one or more direct write sources, optical lenses, optical plates, nonlinear crystals, mirrors (e.g., galvo mirrors), beam splitters, objectives, microscopes, analysis modules, controllers (e.g., stages and scan boxes), masks (e.g., optical masks and/or light modulators), processors, etc. Additional systems and components are described in Kaehr B et al., "Mask-directed multiphoton lithography," *J. Am. Chem. Soc.* 2007; 129(7):1904-5; Kaehr B et al., "Direct-write fabrication of functional protein matrixes using a low-cost Q-switched laser," *Anal. Chem.* 2006; 78(9):3198-202; Kaehr B J, "Defining cellular microenvironments using multiphoton lithography," Ph.D. dissertation for the Department of Biochemistry, University of Texas at Austin, August 2007, 172 pp.; Zarzar L D et al., "Multiphoton lithography of nanocrystalline platinum and palladium for site-specific catalysis in 3D microenvironments," *J. Am. Chem. Soc.* 2012; 134(9):4007-10; Zarzar L D, "Dynamic hybrid materials: hydrogel actuators and catalytic microsystems," Ph.D. dissertation for the Department of Chemistry, Harvard University, May 2013, 154 pp.; and Zhang Y L et al., "Designable 3D nanofabrication by femtosecond laser direct writing," *Nano Today* 2010; 5:435-48, each of which is incorporated herein by reference in its entirety.

EXAMPLES

Example 1: Additive Manufacturing of Crystalline Semiconductor Materials

Semiconductors are the foundational material that underpins all modern electronic devices (e.g., integrated circuits, LEDs, photovoltaics, radiation detectors etc.). Two major factors govern most aspects of their performance: (1) the intrinsic quality of the material (e.g., crystallinity, defect density, and stability) and (2) the material interface (e.g., transistor placement and solid/solid contacts). The ability to direct write, high quality semiconductor materials with site-specific accuracy can drastically free up the design space for various potential applications.

The present invention, in part, relates to an additive manufacturing approach for the emerging class of semiconductor materials broadly known as organometallic perovskites of the form $ABX_3$, in which A is a cation (e.g., an organic ammonium cation), B is a metal (e.g., a metal cation), and X is a halogen (e.g., a halide). Common examples of organometallic perovskites include $CH_3NH_3PbI_3$, $CH_3NH_3PbBr_3$, and $CH_3NH_3PbCl_3$.

Although organometallic perovskite materials have been studied for decades, only recently have they gained widespread attention for their remarkable power conversion efficiency (PCE) employed in a photovoltaic device (from 3% in 2009 to >20% in 2016). Moreover, these materials display exceptional qualities that may prove transformative for the development of low-cost lasers, sensors, and detectors.

Perhaps unsurprisingly, the processing of perovskite materials plays a central role in determining their properties. Indeed, significant efforts are aimed at engineering the ideal perovskite film, with notable contributions coming from solvent engineering, sequential deposition, temperature engineering and stability additives.

Regardless of the preferred method of preparation, there remains the challenge of incorporating perovskite materials into devices. Lead-based perovskites are highly sensitive to degradation; and extended exposure to mixed solvents, photoresists, and etchants imparts challenges for the preservation of desired chemical and/or microstructural properties. Ideally, these materials could be processed in situ, with site-specific accuracy using processes analogous to lithography.

To address this challenge, we surmised that the temperature-dependent (solvent-dependent) solubility of lead halide perovskites could be used as a mechanism to induce highly localized crystal growth, for example, using a laser focused on an absorbing substrate or using a heated sharp tip (e.g., an AFM tip). Further details are provided herein.

Example 2: Experimental Conditions for Laser Direct Write (LDW) of Perovskite Materials The recent incorporation of lead halide perovskites in photovoltaics has proven to be a watershed moment for solar energy research and semiconductor materials science. Yet, many questions remain regarding the fundamental chemistry, physics, material properties and processing of photoactive perovskites. For example, abilities to control seeding and crystallization processes are necessary to develop devices incorporating perovskite-based materials as energy harvesters, photodetectors, light emitting diodes and lasers. Thus, there is a need to develop chemistries and processing strategies that enable precise patterning of perovskites.

Some recent studies have investigated both lithographic and contact printing methods to pattern perovskite materials, but these strategies have drawbacks and do not allow for single step crystallization nor for the writing of arbitrary patterns (e.g., new masks and masters must be generated in order to develop new patterns). Thus, there are opportunities to develop complementary processing techniques for perovskites that are more conducive to rapid prototyping and device functionalization including methods that provide for direct-write printing. To develop a direct write (additive manufacturing) approach, we hypothesized that the temperature-dependent solubility effect of perovskite crystallization could be localized using laser heating. This would allow for the laser direct write (LDW) of perovskites materials.

Initial LDW experiments were conducted under the following liquid precursor conditions. Perovskite precursor reagents were dissolved in stoichiometric ratios of $PbX_2$ and $CH_3NH_3X$. For X=Br, 2 ml stock solutions at 1.7 M (about the solubility limit) were prepared in N,N-dimethylformamide (DMF) by sonication and stirring overnight, yielding a clear solution. For X=1, 2 ml of stock solutions were prepared at nominally 0.5M concentrations (above the solubility limit). After stirring at 80° C. for 1 hour, the mixture was then filtered with a syringe (0.2 m PTFE) to yield a transparent orange solution that was typically 0.2 M.

Specifically for the $CH_3NH_3PbBr_3$ precursor solution, lead (II) bromide ($PbBr_2$ 99.999%) and N,N-dimethylformamide (DMF, anhydrous, 99.8%) were purchased from Sigma-Aldrich Corp. (St. Louis, Mo.). Methylammonium bromide (MABr) was prepared via stoichiometric neutralization of methylamine with HBr in glacial acetic acid at 0° C. After stirring for 3 hours, methylammonium bromide was precipitated by the addition of diethyl ether, filtered, washed, and dried under vacuum. Solutions of $PbBr_2$:MABr (1:1) were mixed in DMF, dissolved using a bath sonicator, and subsequently filtered using a polytetrafluoroethylene membrane filter (0.2 m pore size) prior to laser-induced crystallization of methylammonium lead bromide.

By providing laser illumination within the liquid precursor, a thermal voxel was provided at the focal point of the laser. Frequently, an absorber was employed to enhance the thermal gradient provided by the thermal voxel, in which the absorber can be a region for site-specific crystal synthesis (FIG. 1A) or a film for free-form crystal patterning (FIG. 2A).

In one instance, a Ti:sapphire laser (Tsunami; Spectra Physics) operating at 750 nm was employed. For deposition of platinum crosses, the laser was mode-locked to deliver high frequency (80 MHz) short pulses (60 fs) for multiphoton absorption (for deposition of platinum pad) or continuous wave (CW) mode. The beam was expanded to slightly overfill the back aperture of an oil-immersion objective (Nikon 100× Fluor, 1.3 numerical aperture) situated on an inverted microscope. Laser powers used for these experiments, obtained by attenuating the laser beam using a half-wave plate/polarizing beam-splitter pair, measured between 1-50 mW at the objective. The beam focus was translated in XY using a motorized stage controller to generate simple lines. Seed structures were subsequently grown on the microscope setup using a broadband light source (halogen lamp, 12V, 100 W) focused onto the substrate using the microscope condenser. This provided for uniform heating of the substrate (using Kohler illumination) to the field of view.

Figure 2D:
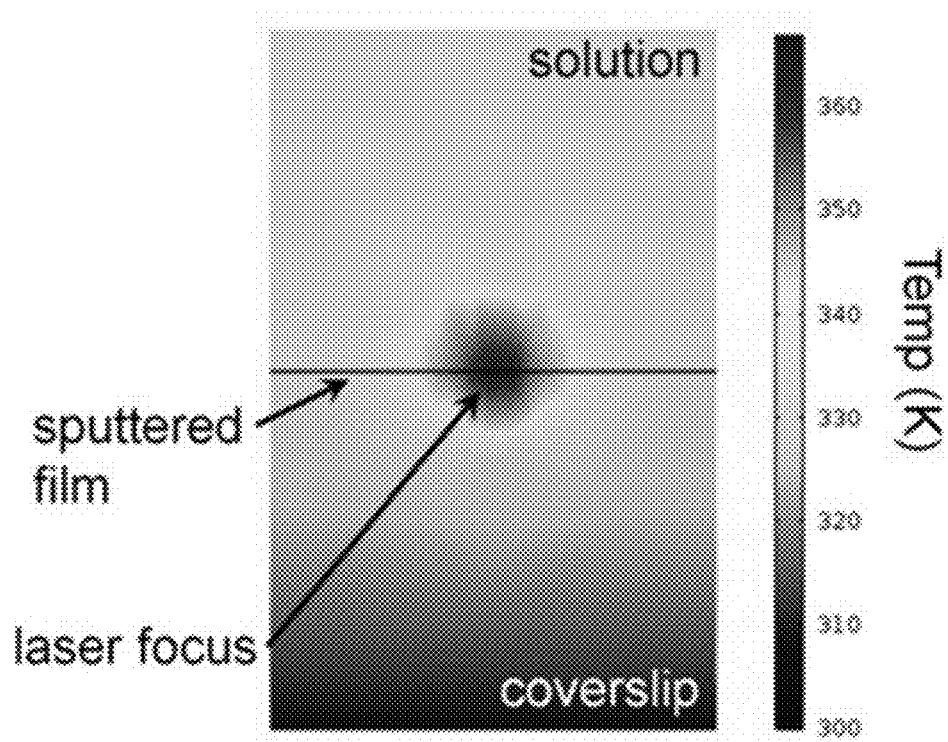

In addition, we modeled the temperature gradient induced via 1 mW of focused laser illumination (FIG. 2D). A relatively low laser input energy (e.g., 1 mW) produced a temperature rise (about 80° C.) that was localized to the beam position (focused here on a 50 nm film of sputtered carbon). This localized thermal voxel induced a temperature gradient, which in turn was sufficient to induce crystallization in the bulk solution. Indeed, following immersion in a precursor solution, crystallites were rapidly generated at the position of the laser spot. By translating the beam in relation to the substrate, perovskite structures could be extended into arbitrary forms in any useful manner, e.g., as described in the following Examples.

Further characterization methods included TEM, which was carried out in an FEI Tecnai F30 operating at 300 kV using a standard double-tilt holder. The perovskite material was laser-written onto a 300-mesh Cu grid with a lacey carbon support film. Time-resolved photoluminescent (TRPL) measurements were performed using 405 nm wavelength excitation from a frequency-doubled Ti:sapphire laser with ~150 fs pulse width and 1 kHz repetition rate. A microscope objective was used to focus the laser source to a spot-size diameter of ~50 m on the sample surface. The light emitted from the sample was collected through the same objective, focused into an optical fiber, and coupled into a spectrometer attached to a Hamamatsu streak camera with 10 ps temporal resolution. For measuring current-voltage and time-dependent characteristics of the interdigitated perovskite device, an Agilent B1500A Semiconductor Device Parameter Analyzer was employed. The device was illuminated in a light-tight enclosure with a high intensity, broadband fiber light source (Part No. OSL1, Thorlabs, Inc., Newton, N.J.) calibrated using a calibrated reference cell (Oriel® Instruments Part No. 91150V).

Example 3: Site-Specific Synthesis of Organometallic Perovskites

Figure 1C:
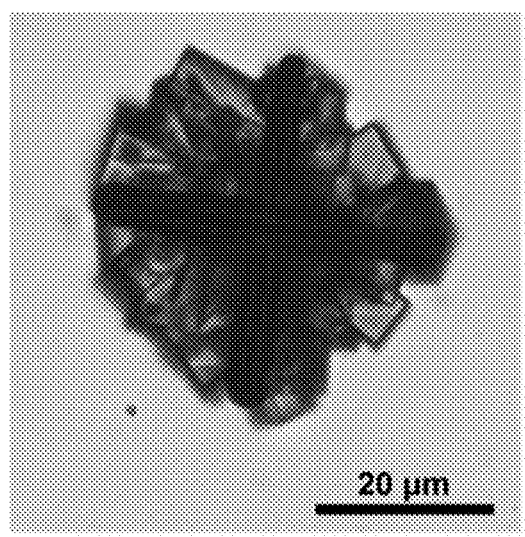

Site-specific patterning of crystals can be provided by a patterned array of absorber regions (FIG. 1A-1C). As described herein, by focusing a direct write source within a liquid precursor in proximity to an absorber region, a thermal voxel is formed at the liquid/absorber interface. This thermal voxel provides a thermal gradient that can promote any useful reaction, such as crystalline seed formation. Thus, by patterning an array of absorbers and providing a thermal voxel at each absorber, an array of crystalline seeds can be formed.

Alternatively, patterning can be achieved by positioning of the direct write source. As seen in FIG. 2A-2B, the substrate 201 can be uniformly patterned within an absorber film 210, and arbitrary patterns can be instilled by translating the direct write source 204 or the substrate 201. Patterning can provide any useful initial crystalline seed structure (see, e.g., FIG. 2C). Simulations of the generated thermal voxel can provide further insight into the reaction process (see, e.g., FIG. 2D).

Figure 3:
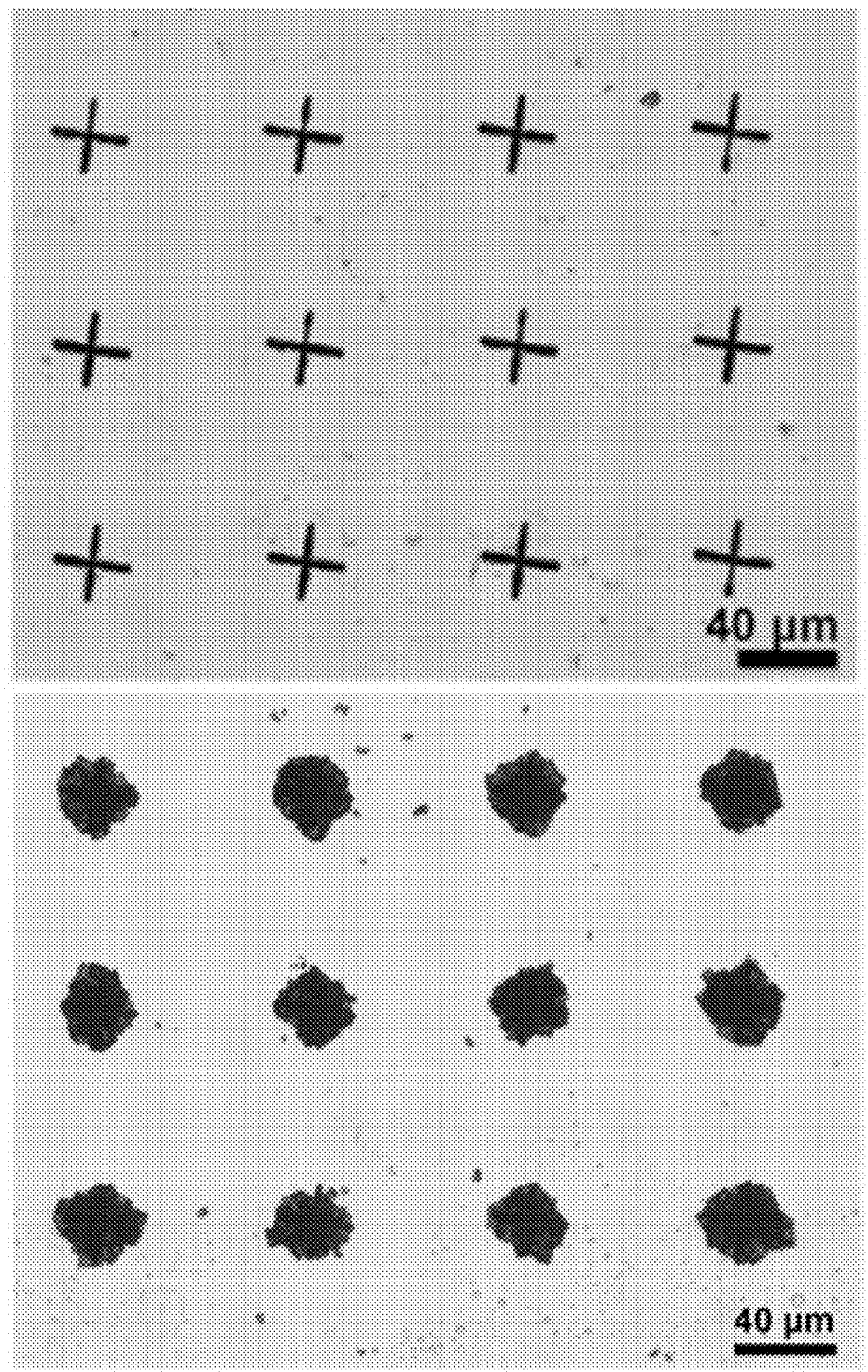
FIG. 3 shows optical images of a substrate before and after direct writing of an array of crystalline material. Provided are images of a substrate having a plurality of absorber regions, which includes an array of platinum crosses (top); and of a substrate after forming a crystalline CH$_3$NH$_3$PbX$_3$ material upon each absorber region by positioning a thermal voxel in its proximity (bottom).

Further crystal growth can be employed to provide an array of crystalline material having an underlying pattern dictated by the absorber array (FIG. 3). Absorbers (e.g., platinum crosses) were patterned onto a glass substrate and immersed in a liquid precursor solution (FIG. 3, top). The backside of the Pt metal was laser-heated to induce crystallization, in this example, of $CH_3NH_3PbBr_3$ perovskite, thereby providing site-specific synthesis of an array of laser direct write (LDW) organometallic perovskites (FIG. 3, bottom).

Example 4: Characterization of LDW Perovskite Materials

Figure 4A:
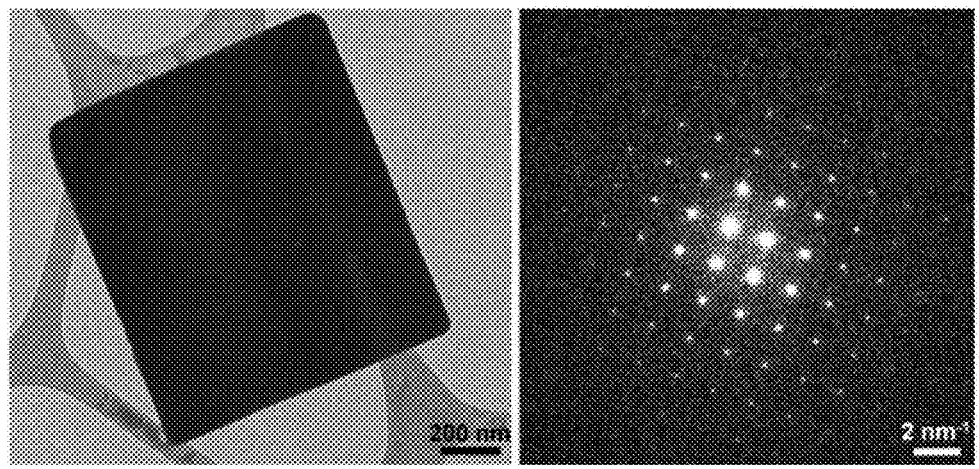
FIG. 4A-4C shows characterization of a CH$_3$NH$_3$PbBr$_3$ material formed by laser direct write (LDW) with a thermal voxel. Provided are a transmission electron microscopy (TEM) image and an electron diffraction pattern of the material, which shows perfect crystallinity (FIG. 4A); an X-ray powder diffraction (XRD) pattern of the material (FIG. 4B); and an image of two-photon induced photoluminescence of the material, having a 750 nm excitation and about 550 nm emission (FIG. 4C).
Figure 4B:
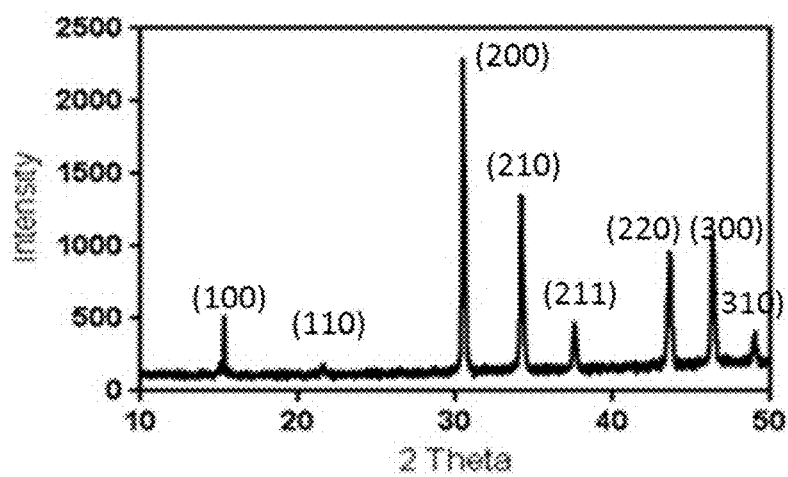
Figure 4C:
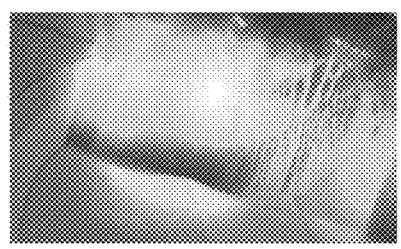

Further studies were conducted to characterize LDW perovskite materials and to preliminarily understand the kinetics of crystal growth and dissolution. Various structural properties confirmed the presence of high quality perovskite materials. For instance, TEM of a laser drawn perovskite showed perfect crystallinity (FIG. 4A), and XRD analysis provided peaks consistent with a $CH_3NH_3PbBr_3$ perovskite crystal (FIG. 4B). Two-photon induced photoluminescence in LDW perovskite was also observed (FIG. 4C, excitation of 750 nm, and observed emission of about 550 nm).

Figure 5A:
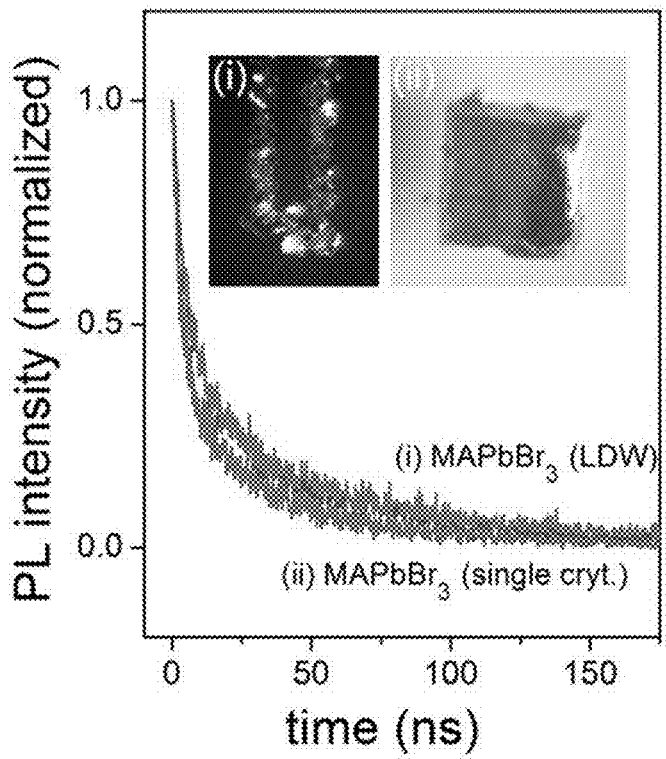
FIG. 5A-5B shows further photoluminescence shows characterization of a CH$_3$NH$_3$PbBr$_3$ (methylammonium lead bromide, or MAPbBr$_3$) material formed by laser direct write (LDW) with a thermal voxel. Provided are graphs showing photoluminescence (PL) of LDW material and bulk material (FIG. 5A) and PL quenching of LDW material on a substrate having graphite or polystyrene (FIG. 5B). Also provided are images of LDW perovskite material (FIG. 5A, inset (i)) and bulk perovskite material (FIG. 5A, inset (ii)).
Figure 5B:
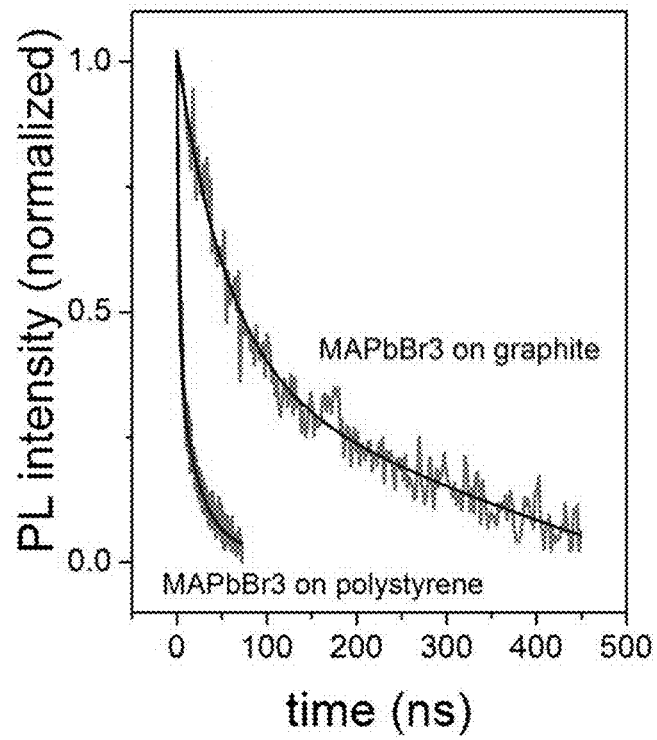

Further optical properties were studied, which compared the photoluminescent (PL) time-resolved decay of LDW perovskite and a single crystal (SC) of perovskite grown in a bulk solution. FIG. 5A shows the decay traces indicating similar transport properties of LDW perovskites versus large single crystals with similar fast (≈5 ns, 3 ns; LDW, SC) and slow (≈41 ns, ≈30 ns; LDW, SC) decay time constants. Substrate-induced quenching was observed on a non-conducting substrate, such as polystyrene (FIG. 5B). Without wishing to be limited by mechanism, we note that the relatively fast decay times for $CH_3NH_3PbBr_3$ perovskite observed here may be due to quenching effects of the sputtered carbon (graphite) substrate, as we observed slower decay (longer lifetime) of the bulk crystal on a non-conducting substrate (FIG. 5B, trace for polystyrene).

Figure 6A:
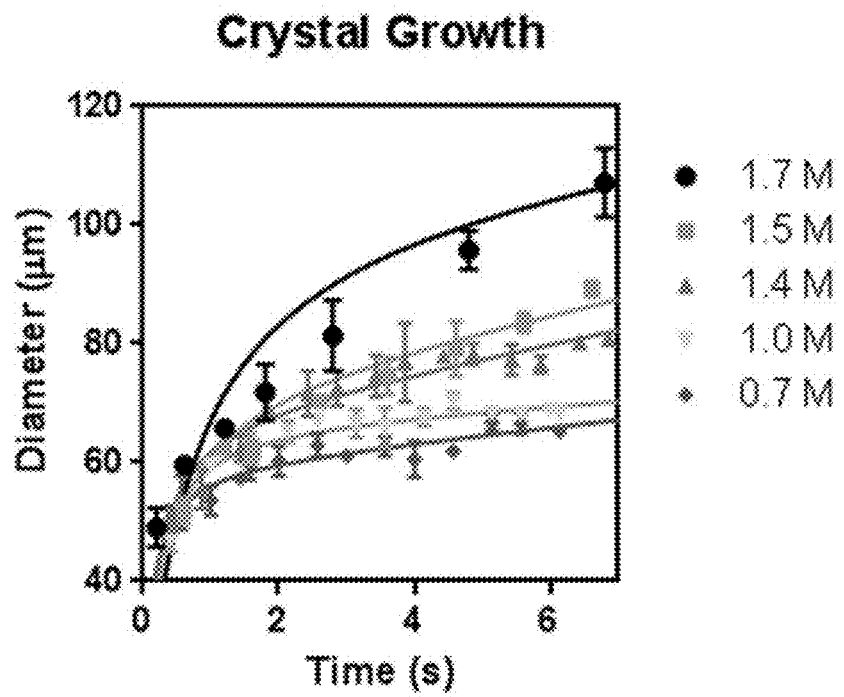
FIG. 6A-6B shows crystalline growth and dissolution of material formed by use of a thermal voxel. Site specific heating was provide by the thermal model, which enabled studies of the effect of precursor concentration on crystal growth (FIG. 6A) and on crystal dissolution (FIG. 6B). By controlling the precursor concentration and the size of the induced crystalline seed, desired characteristics of final patterned crystalline material can be controlled.
Figure 6B:
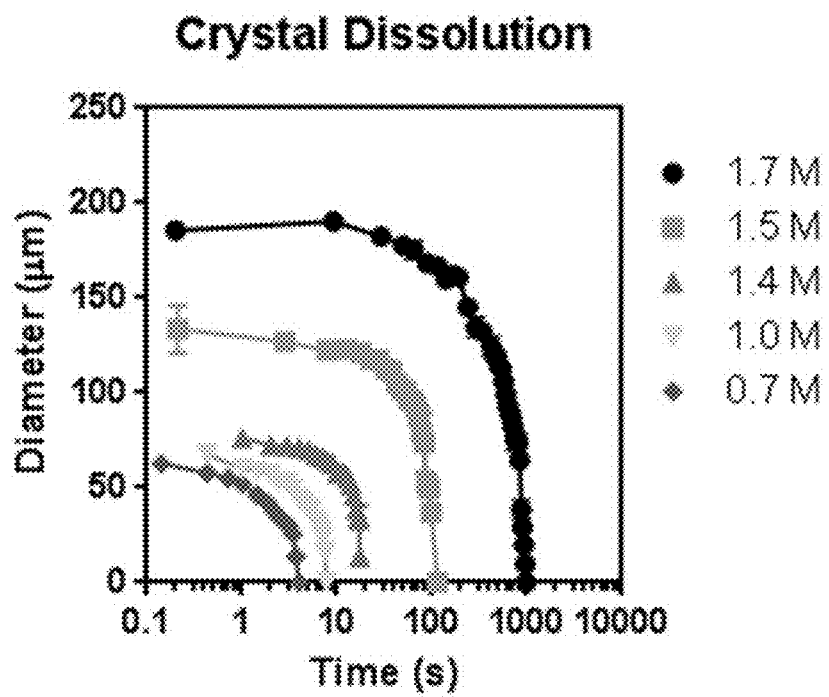

Site-specific heating enabled a more detailed understanding of the dependence of crystal growth and dissolution rates on precursor concentration and size of the initial crystalline seed. FIG. 6A-6B shows the relationship between crystal growth, size, and dissolution with precursor concentration. For $CH_3NH_3PbBr_3$, at precursor concentrations from 0.5 M to 2 M, we observed stable crystal diameters, defined as the time-point of limited further crystal growth (t=7 s), to be variable from 60 to 105 m. Additionally, we observed size dependent dissolution rates of crystals following cessation of laser illumination. As seen in FIG. 6B, the persistence time of the crystals was dependent upon the bath concentration of precursors. For concentrations above 1.5 M, dissolution was sufficiently slow, providing an opportunity for extended patterning. By understanding the effect of precursor concentration on dissolution rate, we optimized conditions for extended patterning of perovskite materials.

Example 5: Laser Direct Write (LDW) of Free-Form Perovskites

Precursor concentration can be selected to provide a long persistence time, which in turn can allow subsequent crystal growth to occur. For instance, a higher concentration of precursor(s) generally provides a slower dissolution rate, thereby allowing patterned crystalline seeds to persist long enough to promote crystal growth. Furthermore, if seed structures can be patterned to have an arbitrary form, then subsequent crystal growth potentially can be predetermined.

Figure 7A:
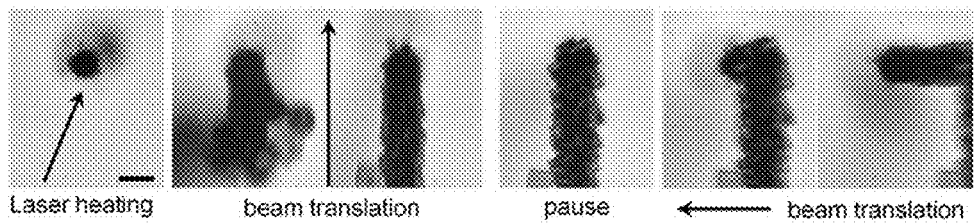
FIG. 7A-7B shows arbitrary patterning of LDW crystalline materials by employing a substrate having an absorber film. Provided are time-lapse images showing LDW of $CH_3NH_3PbBr_3$ on semi-transparent carbon film using relatively low (e.g., 10s of mW) input power (FIG. 7A), as well as images of inducing a laser patterned seed structure and promoting crystal growth of the seed (FIG. 7B). By understanding precursor concentration versus dissolution rate (e.g., as in FIG. 6A-6B), conditions can be optimized for extended patterning of perovskite materials. Seed structures can take arbitrary form, and subsequent crystal growth can be predetermined.

To test this possibility for extended patterned, we sputtered semi-transparent thin films (e.g., Au or C absorber films) onto a substrate (e.g., a microscope coverglass). This light-absorbing layer was expected to function as a transducer to generate localized heating. Indeed, following immersion in a precursor solution, crystallites could be generated at the position of the laser spot. These structures could be extended into arbitrary forms by translating the beam in relation to the substrate (FIG. 7A).

Figure 7B:
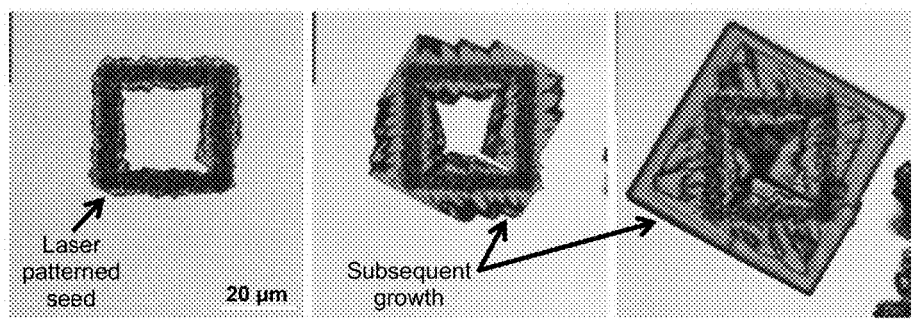

After obtaining a desired crystalline seed pattern, further crystal growth can provide a final crystalline structure. As shown in FIG. 7B, subsequent crystal growth of $CH_3NH_3PbBr_3$ seeded shapes was observed following broadband light illumination (i.e., bulk heating), with preferential growth from highest surface area facets. By careful control of illumination parameters that lead to seed deposition and crystal growth/dissolution, orientation can be pre-determined.

Figure 8A:
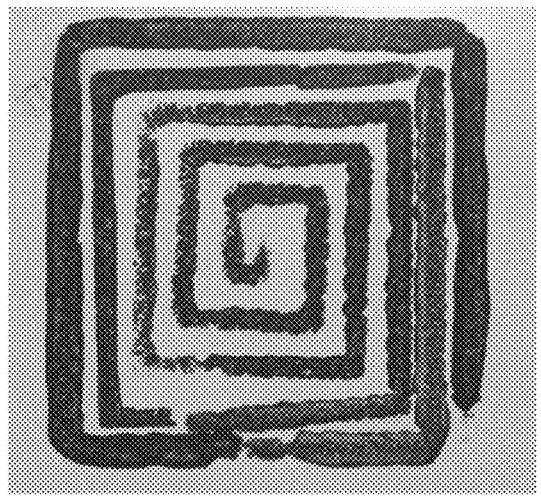
FIG. 8A-8C shows images of free-form or arbitrary patterning of crystalline seed structures. Provided are images of an initial seed pattern (FIG. 8A); a further initial seed pattern (FIG. 8B, left) with subsequent crystal growth (FIG. 8B, right); and yet another initial seed pattern (FIG. 8C, left) with subsequent crystal growth (FIG. 8C, right).
Figure 8B:
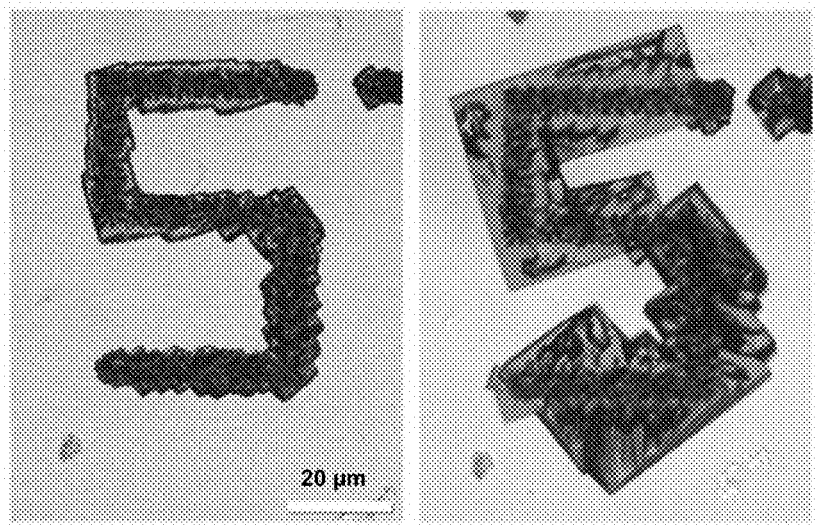
Figure 8C:
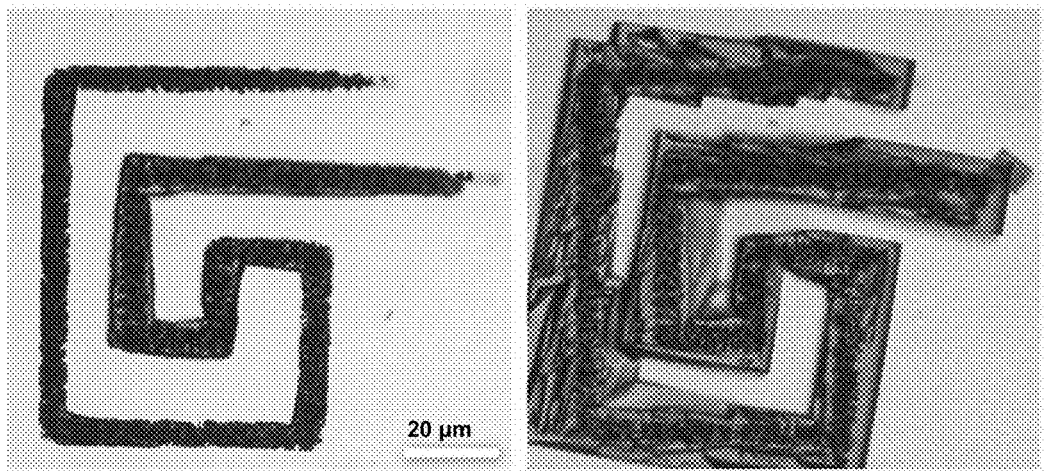

Any useful crystalline seed pattern can be generated, and then crystal growth of the seed can be promoted to provide a crystalline material (FIG. 8A-8C). Accordingly, by understanding precursor concentration versus dissolution rate, we optimized conditions for extended patterning of perovskite materials.

Example 6: Direct Write Perovskite Functionalization of Devices

The methods herein can be employed in any useful manner. In one instance, the methods provide an avenue for arbitrary deposition of a useful class of materials, e.g., lead halide perovskites. These perovskite materials are an important class of photovoltaic/semiconductor materials. The ability to form arbitrary patterns with such a material can provide a straightforward route for the design, iteration, and production of perovskite-based devices.

Figure 9A:
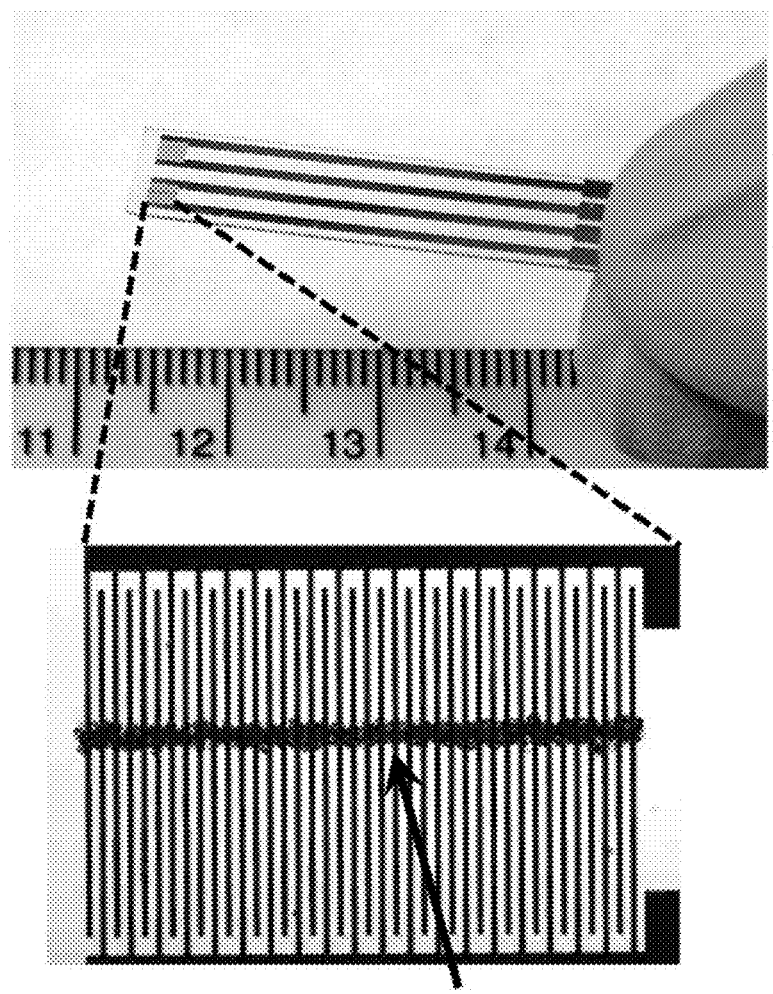
FIG. 9A-9B shows images of a LDW crystalline material employed to provide a wire for a microfabricated photodetector. Provided are images of an interdigitated Au electrode having a $CH_3NH_3PbBr_3$ wire formed by LDW (FIG. 9A) and scanning electron microscope (SEM) images of the $CH_3NH_3PbBr_3$ wire in contact with Au electrodes upon an $SiO_2$ surface (FIG. 9B).
Figure 9B:
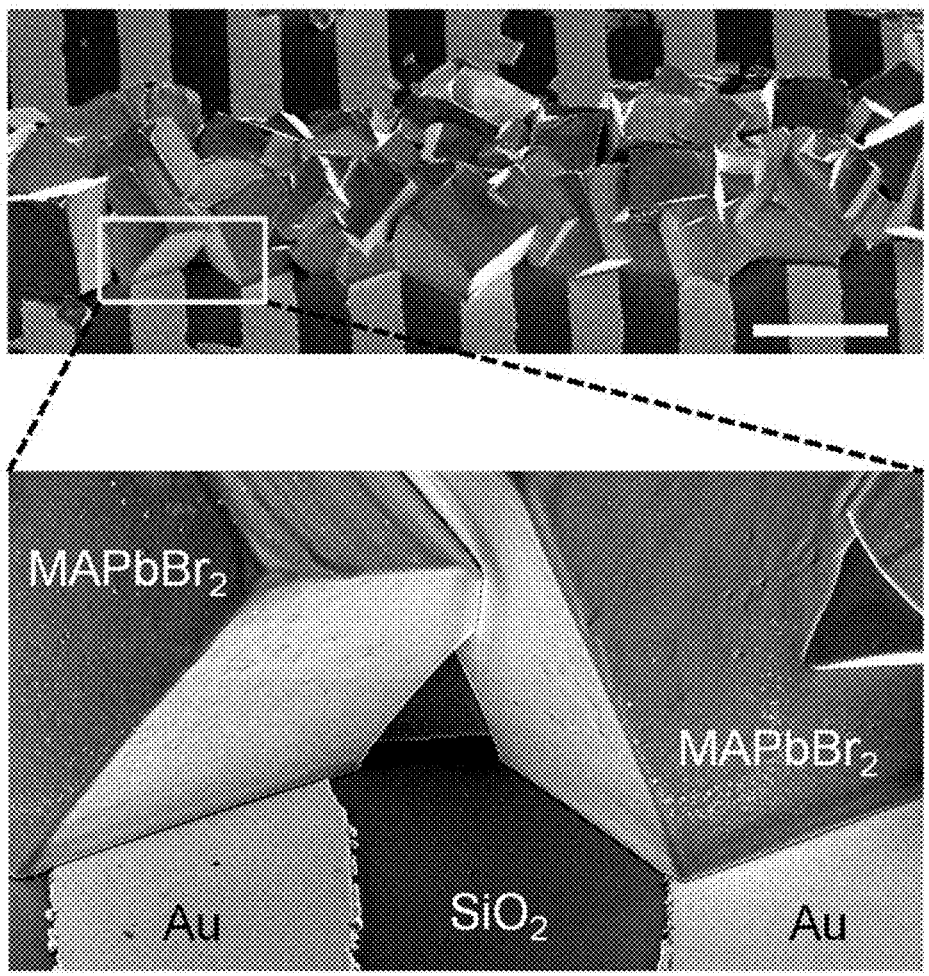

Described herein is a non-limiting device including a laser direct write (LDW) crystalline perovskite material. To demonstrate the utility of the LDW perovskite method, we fabricated a $CH_3NH_3PbBr_3$ wire directly onto an interdigitated micro-electrode array to create a micro-photodetection device. FIG. 9A-9B provides a microfabricated photodetector, which includes an interdigitated Au electrode array (from NanoSPR LLC, Chicago, Ill.) and a $CH_3NH_3PbBr_3$ wire formed by LDW. The wire was composed of large interconnected crystals of $CH_3NH_3PbBr_3$ with an average size of about 80 μm.

Figure 10A:
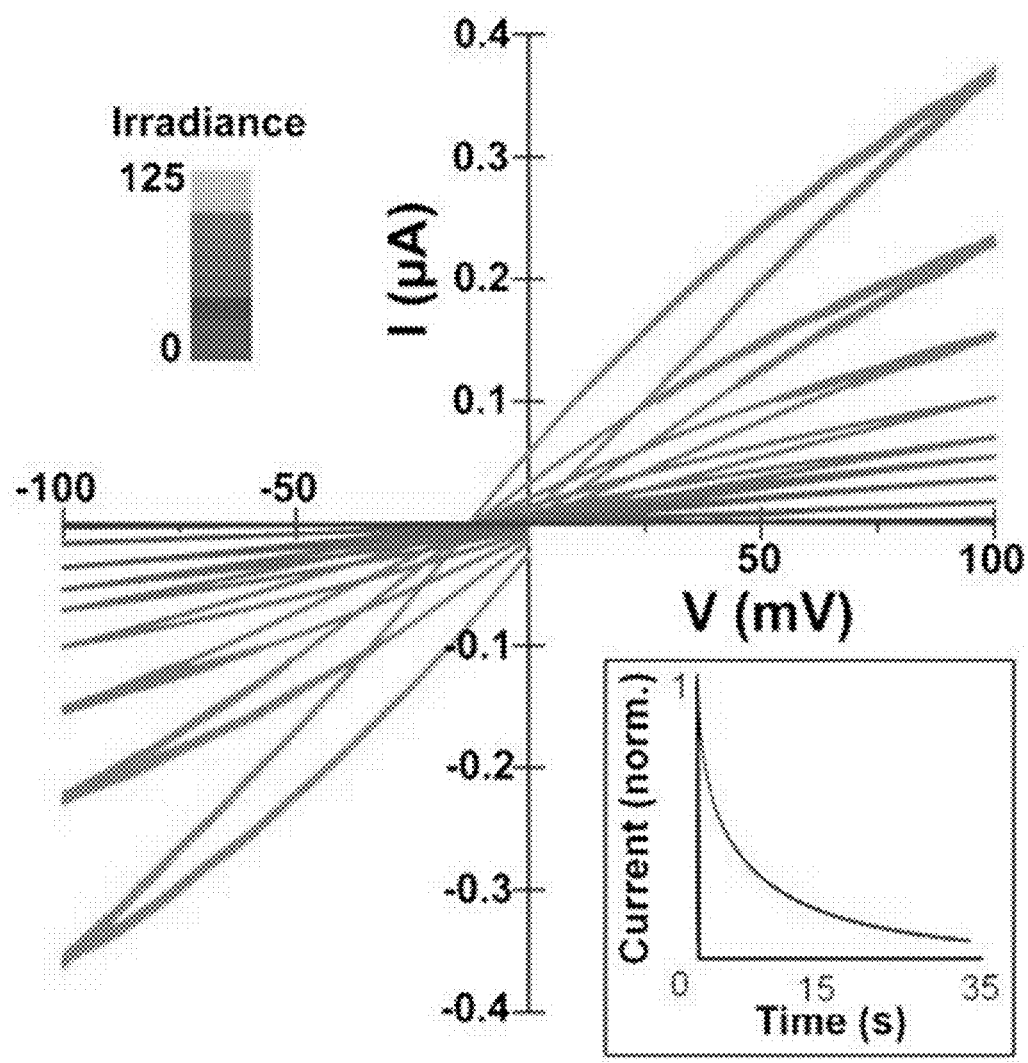
FIG. 10A-10B shows optical characterization of a functional device (the microfabricated photodetector in FIG. 9A-9B). Provided are a graph showing current-voltage curves of the functional device under varying irradiance by a broadband light source (FIG. 10A) and a graph showing photocurrent versus irradiance for the functional device at +100 mV (FIG. 10B). The inset in FIG. 10A shows the current relaxation time, fit by a stretched exponential function, observed after changing the bias from 50 mV to 0 V.

We tested the optical response of the device by measuring current-voltage (I-V) curves to +100 mV under broadband illumination. The I-V curves are plotted in FIG. 10A as a function of irradiance. The symmetry of the curves about zero reflects the fact that we fabricated a symmetric metal-semiconductor-metal device. Without wishing to be limited by mechanism, the hysteresis in these curves may be due to the long relaxation time of the current with respect to the time scale of the current-voltage sweeps. In the inset, we show the normalized relaxation of the dark current after abruptly changing the bias from 50 mV to 0 V. This slow relaxation has many possible origins (e.g., ion migration, trapping and detrapping processes, and others).

Without wishing to be limited by mechanism, in devices with direct perovskite-gold contact, the hysteretic behavior has most commonly been attributed to anion migration, leading to built-in electric fields. This effect has been observed regardless of anion species within the perovskite (e.g., I or Br) and is independent of perovskite preparation. Our device behaves in accordance with these previous studies and others, which have exploited this behavior for optical/electrical resistive switching memory. Though very simple in design, the device exhibited strong on/off ratios, with dark current levels of ~10-12 amps and demonstrates the ability of the LDW approach to yield functional patterns.

Figure 10B:
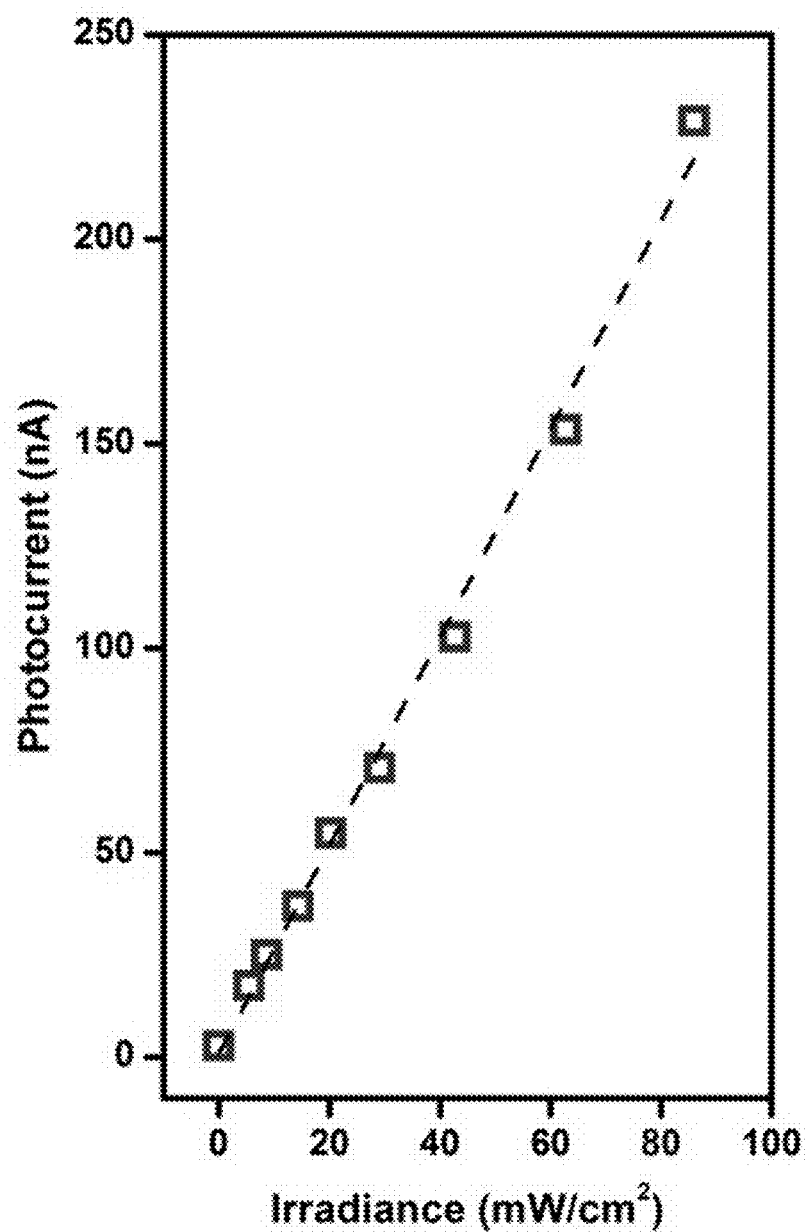

Optical characterization of a functional device showed a nearly linear photocurrent-irradiance behavior at +100 mV (FIG. 10B). As can be seen, functional optoelectronic devices can be fabricated by installing LDW crystalline material onto pre-patterned electrode substrates. LDW of crystalline wires, optical absorption regions, interconnects, contacts, etc. can provide a flexible method for direct growth of useful materials, while avoiding chemical or synthetic conditions that could damage the material.

Example 7: Direct Write and Dissolution of the Crystalline Seed

Figure 11:
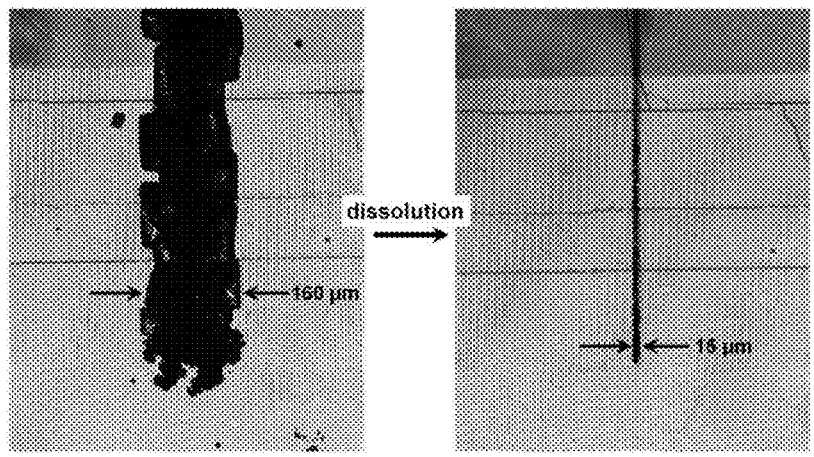
FIG. 11 shows crystal dissolution to resolve crystalline structures. Provided are optical microscope images of a $CH_3NH_3PbBr_3$ line patterned on a polydimethylsiloxane (PDMS) micropatterned substrate, which in turn was coated with 50 nm of sputtered carbon (left). Slow dissolution of the structures resulted in a uniform 15 m wide perovskite structure (right).

As described herein, we demonstrated arbitrary pattern formation of crystalline $CH_3NH_3PbBr_3$, in which perovskite seeds can be grown to large crystals with additional heating. Alternatively, the seeds could be dissolved to tune the feature size, e.g., to index structures onto micro-patterned (silicon) substrates, to control crystal size, to predetermine crystal orientation, etc. As seen in FIG. 11, an initially pattered crystalline seed can be incubated to allow for slow dissolution of the seed, thereby providing a crystalline structure having a narrower width (e.g., a 160 m line that can be dissolved to provide a 15 m line). This capability can be useful for, e.g., lasing and detection platforms using isolated, perovskite pixels. Overall, this method couples solution-based synthesis of this emerging class of semiconductors to additive manufacturing and can provide for a straightforward route for the design, iteration and production of perovskite-based devices.

Example 8. Direct Write on Various Substrates

Figure 12A:
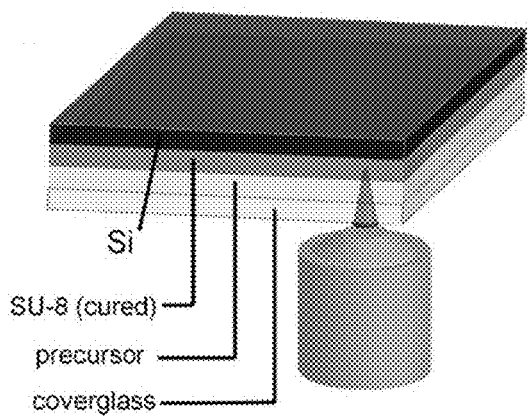
FIG. 12A-12B shows crystalline material deposited on an SU-8 structure that was patterned on a silicon substrate. Provided is a schematic showing an exemplary process employing a direct write source to further pattern a crystalline material on a microwell (a structure formed from developed and cured SU-8 photoresist) patterned upon silicon (FIG. 12A). Also provided is an optical image of a $CH_3NH_3PbBr_3$ line drawn on the microwell pattern (FIG. 12B), followed by dissolution to enable indexing of the perovskite structure to the microwell pattern (8×8 µm squares, 12 µm deep, spaced with 2 µm thick walls).
Figure 12B:
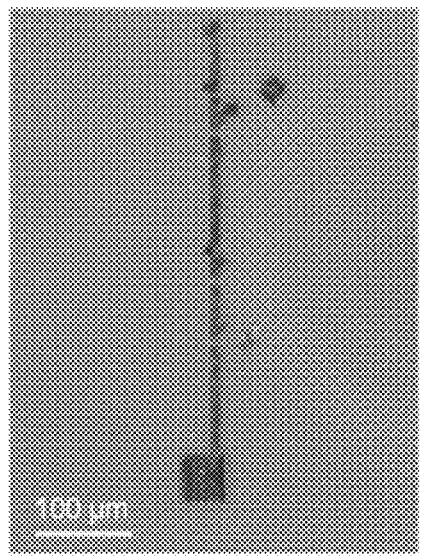

We have also demonstrated arbitrary pattern formation of crystalline $CH_3NH_3PbBr_3$ on a range of substrates. The direct write procedure leverages the inverse temperature solubility of perovskite precursors, which enables site-selective crystallization from solution as directed by laser focus. Furthermore, we show that micropatterned substrates can be employed to form crystalline structures. FIG. 11 shows a $CH_3NH_3PbBr_3$ line patterned on a polydimethylsiloxane (PDMS) micropatterned substrate, which in turn was coated with 50 nm of sputtered carbon. FIG. 12A-12B shows a $CH_3NH_3PbBr_3$ line drawn on a microwell pattern, in which the microwell is patterned from a developed and cured photoresist (SU-8) that is deposited on a silicon substrate. Dissolution was employed to obtain the perovskite structure in FIG. 12B. Control of line width and line position can provide a facile method for indexing structures onto micro-patterned substrates (e.g., for providing perovskite structures to index the photopatterned microwell). Accordingly, the methodologies herein can be adapted to provide patterned and spatially indexed crystalline structures on various types of substrates.

OTHER EMBODIMENTS

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A method of making an organometallic crystalline material, the method comprising:
   inducing an initial organometallic crystalline seed by positioning a direct write source at a first position on a substrate, wherein the direct write source is configured to produce a thermal voxel and has a wavelength of from about 500 nm to about 1,000 nm, and wherein a liquid precursor is in proximity to the substrate, and wherein the seed is a product arising from thermal heating of the liquid precursor by the thermal voxel; and
   promoting crystal growth or crystal dissolution of the seed, thereby providing the organometallic crystalline material that is patterned upon the substrate, wherein the organometallic crystalline material comprises an organic moiety.

2. The method of claim 1, wherein the inducing step comprises translating the thermal voxel from the first position to a second position on the substrate.

3. The method of claim 2, wherein the inducing step further comprises, after the translating step, remaining at the first position for a dwell time sufficient to result in the initial organometallic crystalline seed and then remaining at the second position for a dwell time sufficient to result in a further organometallic crystalline seed.

4. The method of claim 1, wherein the inducing step comprises translating the thermal voxel to a plurality of positions on the substrate, and wherein the plurality of positions, together, provide the initial organometallic crystalline seed comprising a pattern.

5. The method of claim 1, wherein the promoting step comprises incubating the substrate and the initial organometallic crystalline seed under an illumination source.

6. The method of claim 5, wherein the promoting step further comprises employing the liquid precursor comprising a precursor concentration optimized for crystal growth or comprises employing a further liquid precursor comprising a further precursor concentration optimized for crystal growth.

7. The method of claim 1, wherein the promoting step further comprises employing the liquid precursor comprising a precursor concentration optimized for crystal dissolution or comprises employing a further liquid precursor comprising a further precursor concentration optimized for crystal dissolution.

8. The method of claim 1, wherein the liquid precursor comprises an organic precursor reagent and a metal precursor reagent, in which a reaction between the organic and the metal precursor reagents produces the seed and/or the organometallic crystalline material.

9. The method of claim 8, wherein the liquid precursor comprises one or more of the following precursor reagents: $AX^1_m$, $BX^2_n$, $AY_m$, and/or $BY_n$, in which each of m and n is, independently, a number of from about 1 to 5; A comprises an organic moiety; B comprises a metal; each of $X^1$ and $X^2$, independently, comprises a halogen; and Y comprises a leaving group; and wherein the reaction between two or more of the precursor reagents produces the seed and/or the organometallic crystalline material having a formula $ABX^1_3$, $ABX^2_3$, or $ABX^1_a X^2_b$, in which a+b=3.

10. The method of claim 1, wherein the organometallic crystalline material comprises a perovskite.

11. The method of claim 10, wherein the organometallic crystalline material comprises a formula of $ABX_3$, $A_2BX_4$, $A_4BX_6$, or $A_4B_3X_{10}$, in which each A, independently, comprises an organic moiety; each B, independently, comprises a metal; and each X, independently, comprises a halogen.

12. The method of claim 11, wherein A is $R^1NH_3^+$ or $(NR^{1a}R^{1b})R^2(NR^{1a}R^{1b})^+$ in which each of $R^1$, $R^{1a}$, and $R^{1b}$ is, independently, selected from the group consisting of H, optionally substituted $C_{1-24}$ alkyl, optionally substituted $C_{2-24}$ alkenyl, optionally substituted $C_{3-24}$ cycloalkyl, optionally substituted $C_{4-18}$ aryl, optionally substituted $C_{1-24}$ alk-$C_{4-18}$ aryl, and optionally substituted $C_{1-24}$ alk-$C_{3-24}$ cycloalkyl, and in which $R^2$ is an optionally substituted $C_{1-24}$ alkylene; and B is a metal cation.

13. The method of claim 1, wherein the substrate comprises an absorber region or an absorber film.

14. The method of claim 13, wherein the absorber region or absorber film comprises a metal and/or a graphitic carbon, or composites or alloys thereof.

15. The method of claim 1, wherein the direct write source is a continuous wave laser source.

16. The method of claim 1, wherein the seed and/or the organometallic crystalline material is a product arising from solvothermal synthesis and/or crystallization in the presence of the liquid precursor.

17. The method of claim 1, wherein the positioning the direct write source comprises raster scanning across a reflectance mask.

18. The method of claim 17, wherein the positioning the direct write source comprises raster scanning an aligned set of reflectance masks, and wherein the set comprises a plurality of reflectance masks configured to provide a three-dimensional printed structure.

19. A method of making an organometallic crystalline perovskite material, the method comprising:
    providing a liquid precursor comprising an organic component and a metal component, in which a reaction between the organic component and the metal component produces an initial organometallic crystalline perovskite seed, wherein the liquid precursor is in proximity to a substrate;
    inducing formation of the initial organometallic crystalline perovskite seed by positioning a direct write source at a first position on the substrate, wherein the direct write source is configured to produce a thermal voxel within a volume of the liquid precursor and has a wavelength of from about 500 nm to about 1,000 nm, and wherein the initial organometallic crystalline perovskite seed is a product arising from thermal heating of the liquid precursor by the thermal voxel; and
    promoting crystal growth or crystal dissolution of the initial organometallic crystalline perovskite seed, thereby providing the organometallic crystalline perovskite material that is patterned upon the substrate, wherein the organometallic crystalline perovskite material comprises an organic moiety.

20. The method of claim 19, wherein the inducing step comprises translating the thermal voxel from the first position to a second position on the substrate and then remaining at the second position for a dwell time sufficient to result in a further organometallic crystalline perovskite seed.

21. The method of claim 19, wherein the inducing step comprises translating the thermal voxel to a plurality of positions on the substrate, and wherein the plurality of positions, together, provide the initial organometallic crystalline perovskite seed comprising a pattern.

22. The method of claim 19, wherein the promoting step comprises incubating the substrate and the initial organometallic crystalline perovskite seed under an illumination source.

23. The method of claim 19, wherein the liquid precursor comprises one or more of the following precursor reagents: $AX^1_m$, $BX^2_n$, $AY_m$, and/or $BY_n$, in which each of m and n is, independently, a number of from about 1 to 5; A comprises an organic moiety; B comprises a metal; each of $X^1$ and $X^2$, independently, comprises a halogen; and Y comprises a leaving group; and wherein the reaction between two or more of the precursor reagents produces the seed and/or the organometallic crystalline perovskite material having a formula $ABX^1_3$, $ABX^2_3$, or $ABX^1_a X^2_b$, in which a+b=3.

24. The method of claim 23, wherein the organometallic crystalline perovskite material has a formula of $ABX_3$, $A_2BX_4$, $A_4BX_6$, or $A_4B_3X_{10}$, in which each A, independently, comprises an organic moiety; each B, independently, comprises a metal; and each X, independently, comprises a halogen.

25. The method of claim 19, wherein the substrate comprises an absorber region.

26. The method of claim 19, wherein the direct write source is a continuous wave laser source.

* * * * *